US011631754B2

(12) United States Patent
Lin et al.

(10) Patent No.: US 11,631,754 B2
(45) Date of Patent: Apr. 18, 2023

(54) METHOD OF FABRICATING SEMICONDUCTOR DEVICE

(71) Applicant: TAIWAN SEMICONDUCTOR MANUFACTURING CO., LTD., Hsinchu (TW)

(72) Inventors: Zhi-Chang Lin, Hsinchu County (TW); Wei-Hao Wu, Hsinchu (TW); Jia-Ni Yu, New Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 133 days.

(21) Appl. No.: 17/339,795

(22) Filed: Jun. 4, 2021

(65) Prior Publication Data

US 2021/0296468 A1 Sep. 23, 2021

Related U.S. Application Data

(62) Division of application No. 16/142,672, filed on Sep. 26, 2018, now Pat. No. 11,031,489.

(51) Int. Cl.
| | |
|---|---|
| *H01L 29/66* | (2006.01) |
| *H01L 23/535* | (2006.01) |
| *H01L 29/78* | (2006.01) |
| *H01L 29/08* | (2006.01) |
| *H01L 29/06* | (2006.01) |

(52) U.S. Cl.
CPC ........ *H01L 29/6681* (2013.01); *H01L 23/535* (2013.01); *H01L 29/0649* (2013.01); *H01L 29/0847* (2013.01); *H01L 29/7851* (2013.01)

(58) Field of Classification Search
CPC ..... H01L 21/823821; H01L 21/823431; H01L 21/845; H01L 23/535; H01L 27/0924; H01L 29/0649; H01L 29/0847; H01L 29/66795; H01L 29/6681; H01L 29/7848; H01L 29/785; H01L 29/7853
See application file for complete search history.

(56) References Cited

U.S. PATENT DOCUMENTS

| | | | |
|---|---|---|---|
| 2011/0210393 A1* | 9/2011 | Chen | .................... H01L 29/7848 257/E29.264 |
| 2015/0041913 A1 | 2/2015 | An | |
| 2016/0079367 A1 | 3/2016 | Yoo | |
| 2016/0163799 A1 | 6/2016 | Kim | |
| 2016/0268434 A1* | 9/2016 | Ching | ................. H01L 29/0847 |
| 2019/0067417 A1 | 2/2019 | Ching | |

* cited by examiner

*Primary Examiner* — Brook Kebede
(74) *Attorney, Agent, or Firm* — Maschoff Brennan

(57) ABSTRACT

A method includes forming an active fin using a hard mask as an etching mask, wherein the active fin comprises a source region, a drain region, and a channel region, the hard mask remains over the active fin after etching the semiconductive substrate, and the hard mask has a first portion vertically overlapping the source region of the active fin, a second portion vertically overlapping the channel region of the active fin, and a third portion vertically overlapping the drain region of the active fin. A sacrificial gate is formed over the second portion of the hard mask and the channel region of the active fin. The first and third portions of the hard mask are etched. After etching the first and third portions of the hard mask, a gate spacer is formed extending along sidewalls of the sacrificial gate, and the sacrificial gate is replaced with a replacement gate.

20 Claims, 23 Drawing Sheets

METHOD OF FABRICATING SEMICONDUCTOR DEVICE

PRIORITY CLAIM AND CROSS-REFERENCE

This application is a divisional of U.S. application Ser. No. 16/142,672, filed on Sep. 26, 2018, now U.S. Pat. No. 11,031,489, issued on Jun. 8, 2021, the entirety of which is incorporated by reference herein in their entireties.

BACKGROUND

The semiconductor integrated circuit (IC) industry has experienced exponential growth. Technological advances in IC materials and design have produced generations of ICs, where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
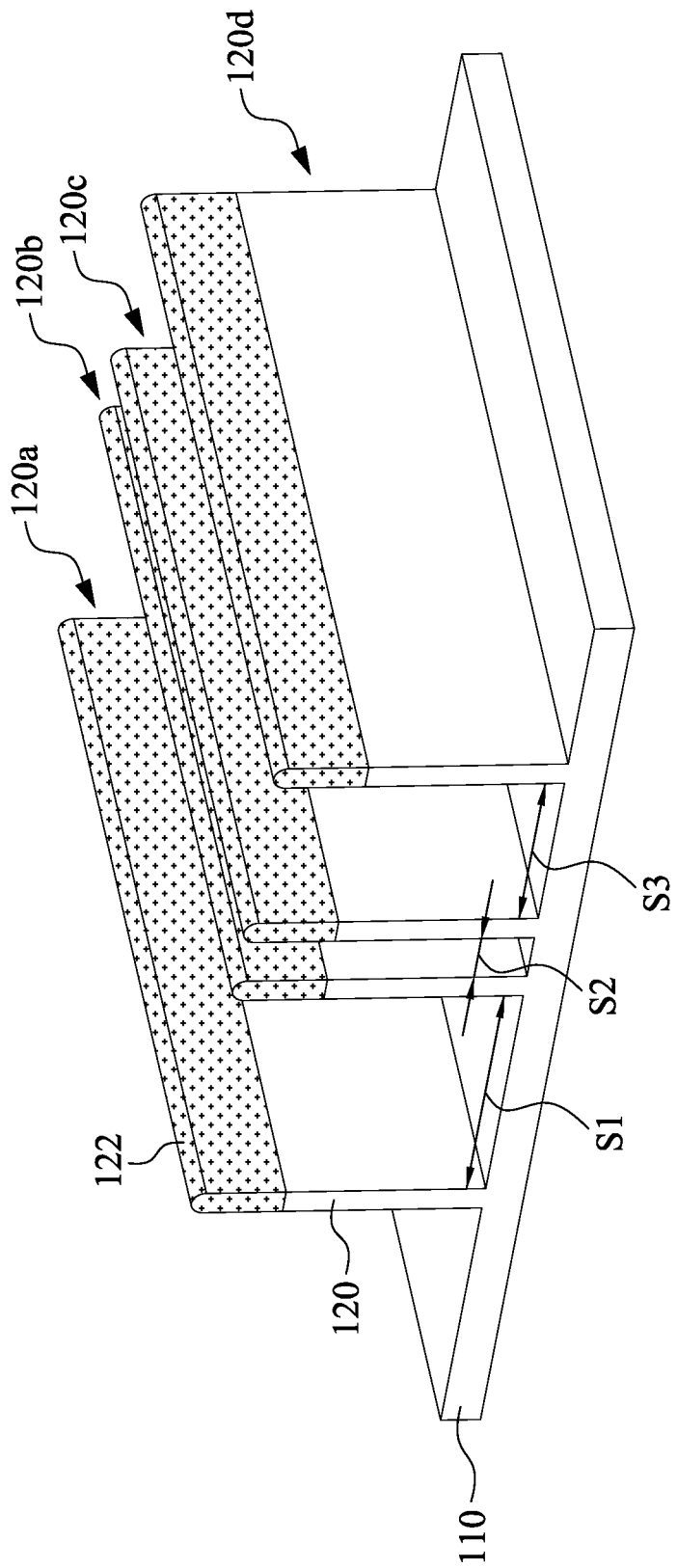
FIG. 1 to FIG. 12 are schematic top views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 to FIG. 12 are schematic top views of a method for manufacturing a semiconductor device at various stages in accordance with some embodiments of the present disclosure. Reference is made to FIG. 1. A plurality of active fins 120 are formed on the substrate 110. In some embodiments, the substrate 110 can be made of silicon or some other suitable elementary semiconductor such as, for example, diamond or germanium (Ge); a suitable compound semiconductor such as, for example, silicon carbide (SiC), indium arsenide (InAs), or indium phosphide (InP); or a suitable alloy semiconductor such as, for example, silicon germanium carbide (SiGeC), gallium arsenic phosphide (GaAsP), or gallium indium phosphide (GaInP).

The active fins 120 are formed protruding from the substrate 110 and are mutually parallel and extend in one direction. Although four active fins 120 are illustrated in FIG. 1, fewer or more active fins can be included in semiconductor structure. In some embodiments, active fins 120 can be doped with n-type dopants such as, for example, phosphorus (P) and arsenic (As), or p-type dopants such as, for example, boron (B) and gallium (Ga). In some embodiments, some fin structures are doped with n-type dopants and are used in n-type FinFETs (e.g., NMOS devices), while some other fin structures are doped with p-type dopants and are used in in p-type FinFETs (e.g., PMOS devices). In some embodiments, active fins 120 include Si, SiGe, or other suitable III-V semiconductor materials. In some embodiments, the material of the active fins 120 includes GaAs, InGaAs, InAlGaSb, InP, InAlGaP, or other suitable materials. In some embodiments, the material of the hard mask layer 122 includes SiCN, SiN, SiOx, SiON, SiOCN, BN or metal oxides such as, for example, $HfO_2$, $ZrO_2$, $Al_2O_3$, other suitable metal oxides, and/or combinations thereof. In some embodiments, the hard mask layer 122 includes multiple layers that include different materials.

In some embodiments, the active fins 120 are formed by patterning a hard mask layer 122 and etching into substrate 110 using an anisotropic etch (e.g., dry etch). In some embodiments, the anisotropic etch uses chlorine and/or fluorine based chemicals. The areas covered by the hard mask layer 122 are blocked by the hard mask layer 122 during the anisotropic etch process, and the areas not covered by hard mask layer 122 are recessed, resulting in the active fins 120 on the substrate 110. One or more cleaning processes are performed after forming the active fins 120. The hard mask layer 122 remains on the active fins 120 after the cleaning processes.

Although four active fins 120 are illustrated in FIG. 1, fewer or more active fins can be included in semiconductor structure. Also, the spaces between the active fins 120 can be the same or different. For example, the active fins 120 include a first active fin 120a, a second active fin 120b, a third active fin 120c, and a fourth active fin 120d, sequentially arranged. A space S1 is between the first active fin 120a and the second active fin 120b, a space S2 is between the second active fin 120b and the third active fin 120c, and a space S3 is between the third active structure 120c and the fourth active fin 120d. The space S2 can be substantially equal to a predetermined fin pitch. The space S3 is greater than the space S2, for example, about twice as the space S2, and the space S1 is greater than the space S3.

Figure 2:
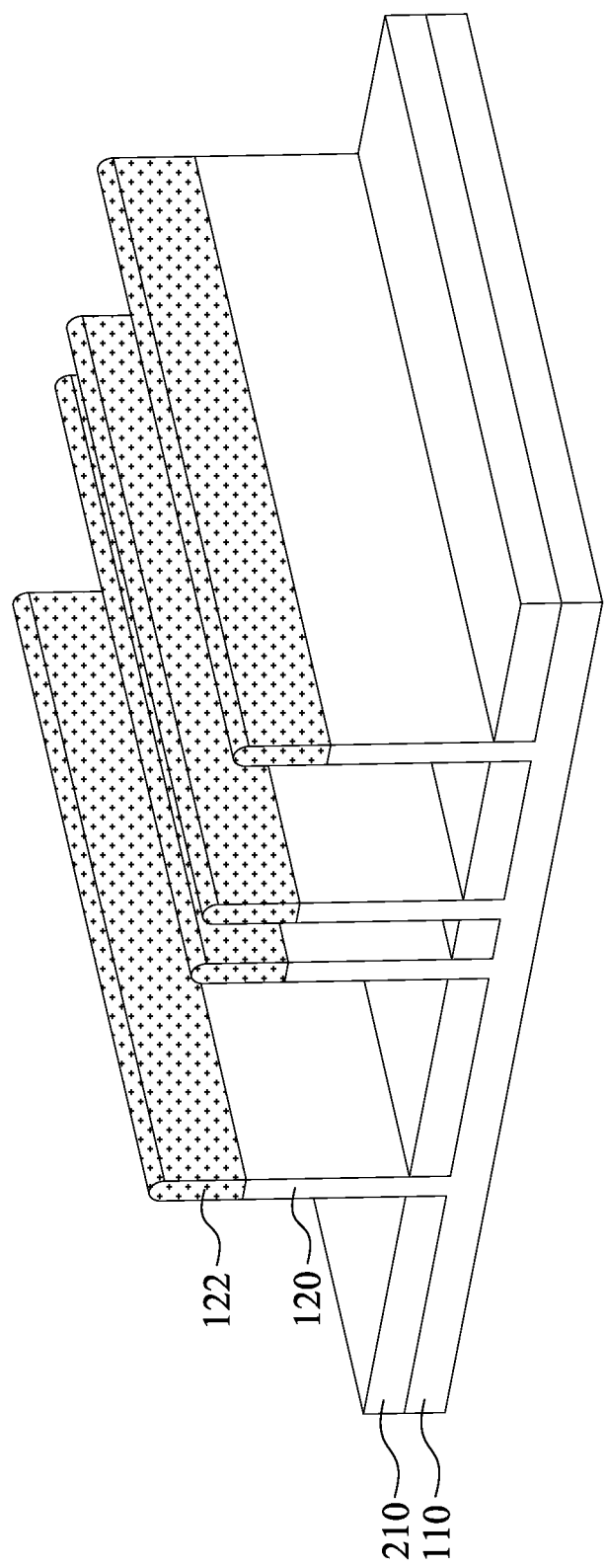

Reference is made to FIG. 2. Isolation material (or so-called a "shallow-trench-isolation (STI)" layer) is formed to surround the active fins 120. The formation of the isolation material may include filling the spaces between the active fins 120 and/or a space between one active fin 120 and another element formed over the substrate 110 with a dielectric material. The isolation material can be formed using, for example, flowable chemical vapor deposition (FCVD), and performing a chemical mechanical polish (CMP) to level the top surface of the dielectric material with the top surface of the active fins 120. In some embodiments, the isolation material may include one or more layers of silicon oxide, silicon nitride, silicon oxynitride (SiON), SiOCN, fluorine-doped silicate glass (FSG), or a low-K dielectric material. The isolation material is recessed to form isolation structures 210 adjacent to and in contact with the bottom portions of the active fins 120. The isolation structures 210 provide isolation between the adjacent active fins structures 120.

Figure 3:
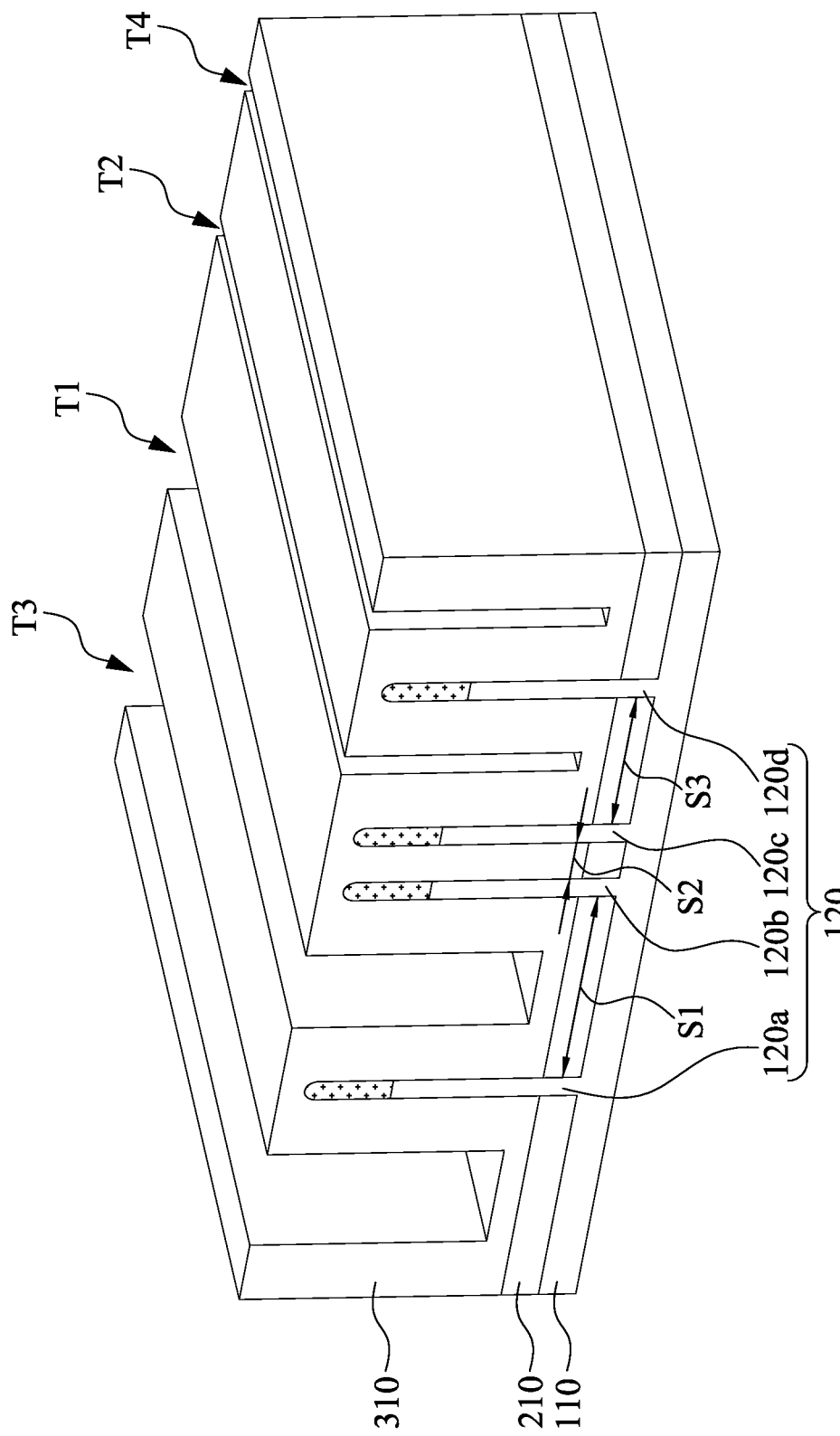

Reference is made to FIG. 3. Spacing layer material 310 can be deposited on the exposed sidewalls and top planar surfaces of active fins 120 and exposed top surfaces of isolation structures 210. In some embodiments, the spacing layer material 310 can be directly formed over substrate 110 without isolation structure 210. In some embodiments, the spacing layer material 310 can be made of the same material as the isolation structures 210, such as silicon oxide, silicon nitride, silicon oxynitride, FSG, a low-k dielectric material, and/or other suitable insulating material. In some embodiments, the spacing layer material 310 can be deposited by an ALD process. In some embodiments, the deposition of the spacing layer material 310 can be done by any suitable processes such as, for example, plasma-enhanced ALD (PEALD), CVD, PVD, molecular beam epitaxy (MBE), high density plasma CVD (HDPCVD), metal organic (MOCVD), remote plasma CVD (RPCVD), PECVD, other suitable methods, and/or combinations thereof. In some embodiments, the thickness of the spacing layer material 310 can be in a range of about 5 nm to about 30 nm. In some embodiments, the spacing layer material 310 is deposited on the top planar surfaces of the active fins 120. The spacing layer material 310 is also deposited in exposed surfaces between the active fins 120, such as exposed sidewalls of the active fins 120 and exposed top surfaces of the isolation structures 210.

The nominal thickness of the spacing layer material 310 can be achieved by controlling deposition parameters of the deposition process such as, for example, the process time, process temperature, pulse length, plasma power, chamber pressure, gas flow rate, other suitable parameters, and/or combinations thereof. In some embodiments, the deposition process can be a timed deposition process where a longer processing time can result in a greater thickness, and the deposition process can continue until a nominal thickness is achieved.

The thickness of the spacing layer material 310 and the spaces between the active fins 120 are designed to control whether trenches are formed between the active fins 120 or not. After depositing the spacing layer material 310, the spacing layer material 310 is deposited on both opposing sidewalls and the top surfaces of the first, second, third, and fourth active fins 120a-120d. In some embodiments, the spacing layer material 310 can substantially fill the space S2 between the second active fin 120b and the third active fin 120c, i.e., the thickness of the spacing layer material 310 can be at least half of width of the space S2 in order to substantially fill the space S2 between the second active fin 120b and the third active fin 120c.

In some embodiments, after the spacing layer material 310 is deposited, the spaces S1 and S3 are not substantially filled with the spacing layer material 310, and thus trenches T1 and T2 are formed between the first and second active fins 120a, 120b and the third and fourth active fins 120c, 120d, respectively. In some embodiments, additional trenches, such as trenches T3 and T4 are formed between the first active fin 120a and adjacent component (not shown) and between the fourth active fin 120d and adjacent component (not shown).

In some embodiments, the width of the trenches T2 and T4 is substantially equal to the width of any one of the active fins 120a-120d. In some embodiments, the width of the trenches T1 and T3 is greater than the trenches T2 and T4, that is, the distance between the spacing layer material 310 on the opposite surfaces of the first and second active fins 120a and 120b is greater than the width of any one of the active fins 120a-120d.

In some embodiments, additional patterning process can be optionally performed to shape the trenches T1, T2, T3, and T4. The patterning process to shape the trenches T1, T2, T3, and T4 includes removing portions of spacing layer material 310, active fins 120a-120d, and isolation structures 210 by a reactive ion etching (RIE) processes, a wet etching process, other suitable processes, and/or combinations thereof.

In some other embodiments, the spacing layer material 310 is deposited to excess over the top surface of the active fins 120a-120d and fills the spaces therebetween. The trenches, such as trenches T1, T2, T3, and T4 can be formed by using a patterning and etching process. In some embodiments, an exemplary patterning process can include forming a photoresist layer over the exposed surfaces of spacing layer material 310, exposing the resist to a mask or reticle having a pattern thereon, performing a post-exposure bake process, and developing the resist to form a masking layer. In some embodiments, the masking layer can be hard masks such as, for example, silicon nitride layers, other suitable layers, and/or combinations thereof. Surface areas of spacing layer material 310 that are not protected by the masking layer are etched using, for example, a reactive ion etching (RIE) processes, a wet etching process, other suitable processes, and/or combinations thereof. After the etch process, the masking layer is subsequently removed by any suitable process such as, for example, any suitable resist strip process, plasma ash process, hard mask removal process, and/or any other suitable processes.

Figure 4:
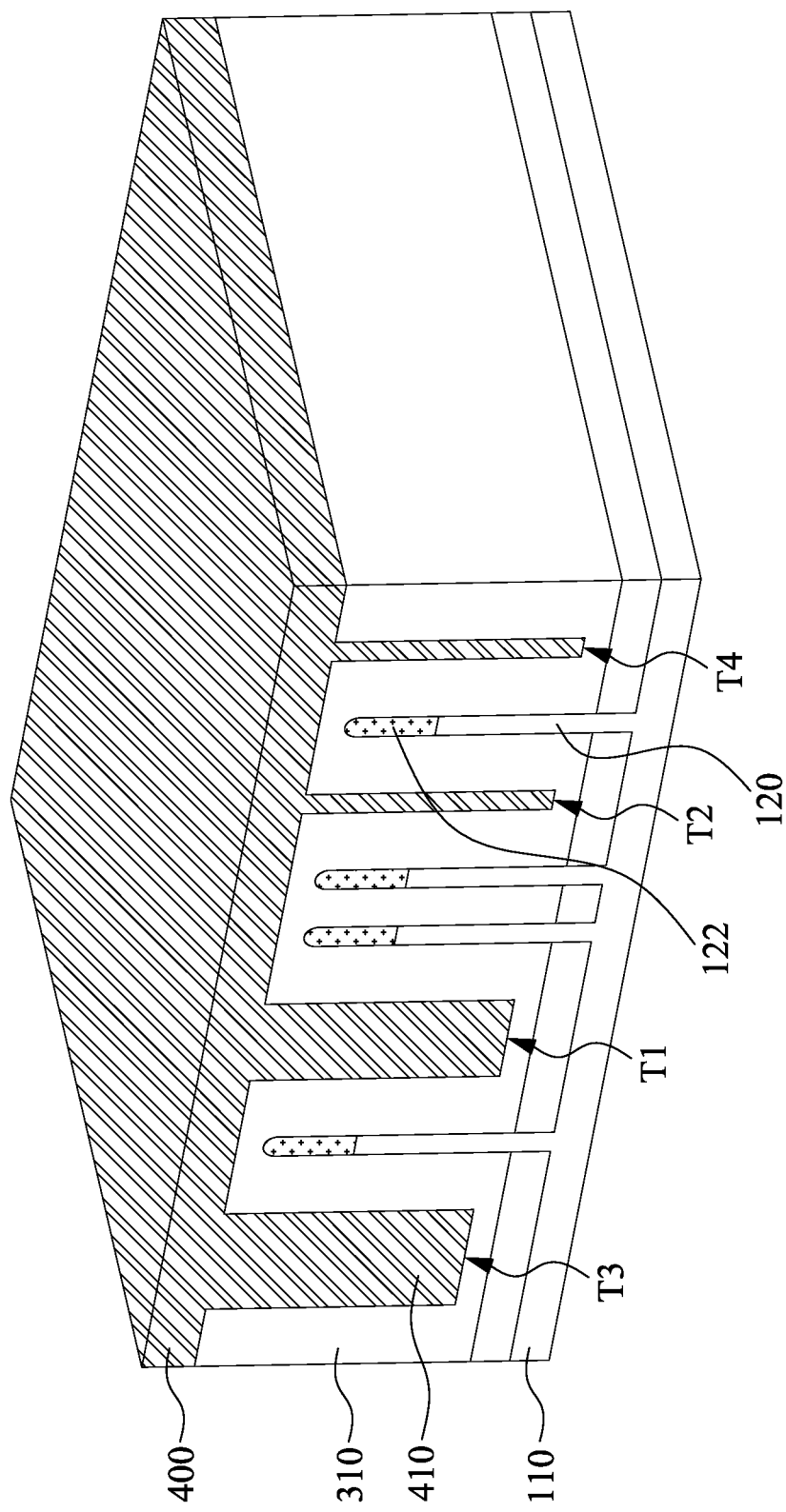

Reference is made to FIG. 4. Self-aligned isolation fins 410 are then formed in the trenches, such as trenches T1, T2, T3, and T4 in FIG. 3. In some embodiments, forming the self-aligned isolation fins 410 includes filling the trenches T1, T2, T3, and T4 with a dielectric material 400. In some embodiments, the trenches T1, T2, T3, and T4 can be filled by any suitable processes such as, for example, ALD, CVD, FCVD, PVD, MBE, HDPCVD, MOCVD, RPCVD, PECVD, other suitable methods, and/or combinations thereof. In some embodiments, the process of filling trenches T1, T2, T3, and T4 with the dielectric material is performed at a temperature in a range from about 400° C. to about 700° C. In some embodiments, the dielectric material can be deposited using an FCVD process with a processing temperature in a range from about 200° C. to about 400° C., followed by a subsequent ultra-violet (UV) curing and annealing process. In some embodiments, the annealing process can be performed at a temperature in a range from about 500° C. to about 800° C. In some embodiments, in-situ doping of carbon and/or nitrogen can be performed to cure or solidify the dielectric material during the FCVD process. In some embodiments, the dielectric material includes SiCN, SiN, SiOx, SiON, SiOCN, BN or metal oxides such as, for example, $HfO_2$, $ZrO_2$, $Al_2O_3$, other suitable metal oxides, and/or combinations thereof. In some embodiments, forming the self-aligned isolation fins 410 further includes performing a planarization step (e.g., a CMP step) to remove the excess dielectric material 400 on the upper surfaces of spacing layer material 310, so that the upper surfaces of the self-aligned isolation fins 410 and the upper surface of spacing layer material 310 are substantially coplanar.

In some embodiments, the height of the hard mask layer 122 on the active fins 120 is in a range from about 6 nm to about 30 nm. If the height of the hard mask layer 122 on the active fins 120 is greater than 30 nm, the total height of the hard mask layer 122 and the active fins 120 would be too high such that the active fins 120 may bend or tilt. If the height of the hard mask layer 122 on the active fins 120 is smaller than 6 nm, the depth of the trenches, such as trenches T1, T2, T3, and T4 would not enough to form the self-aligned isolation fins 410.

The deposition of dielectric material forms self-aligned isolation fins 410 in the trenches T1, T2, T3, and T4. As the trenches T1, T2, T3, and T4 are defined and formed prior to the deposition of dielectric material, no alignment process is needed when the dielectric material fills in the exposed trenches T1, T2, T3, and T4.

Figure 5:
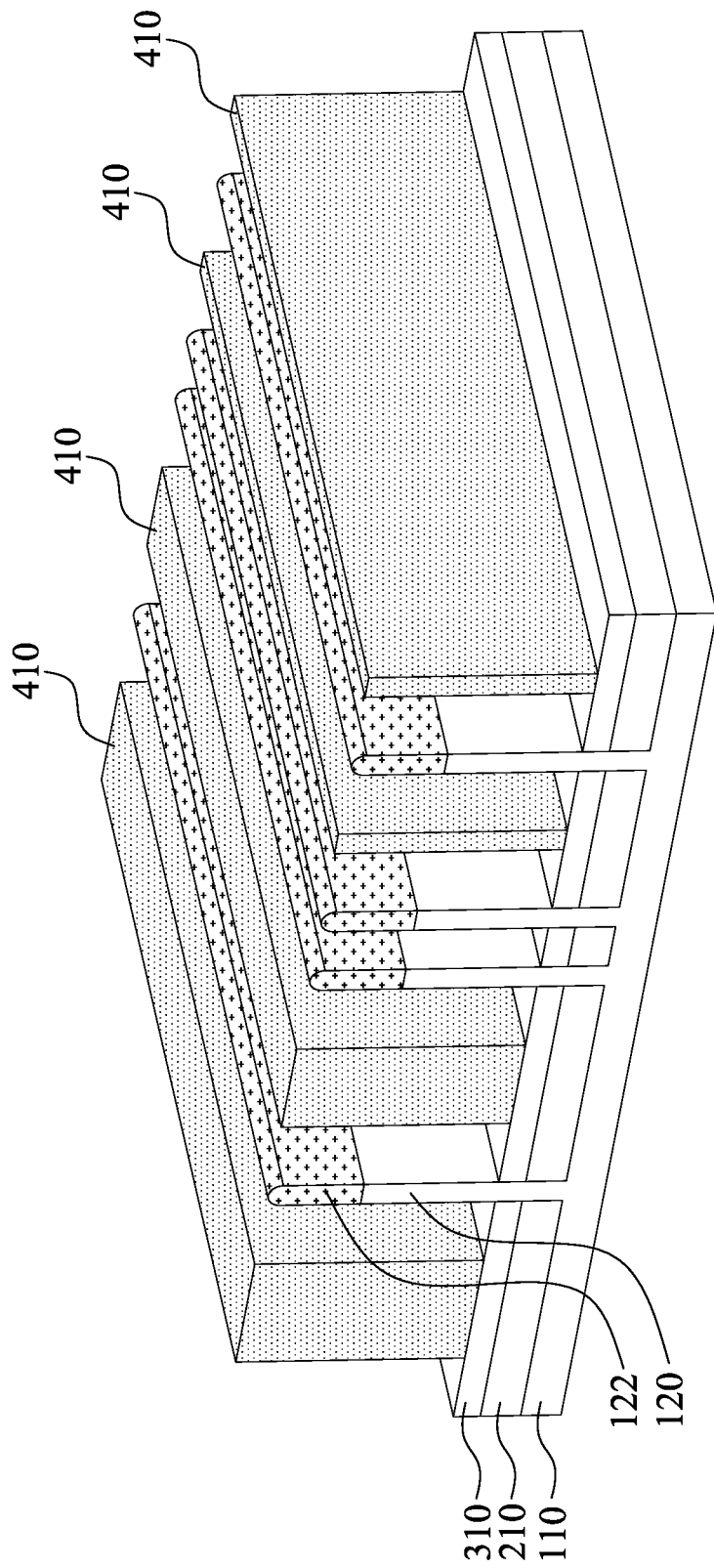

Reference is made to FIG. 5. The spacing layer material 310 in FIG. 4 is etched back such that the active fins 120 and the self-aligned isolation fins 410 protrudes from the remaining portions of spacing layer material 310. The remaining portions of spacing layer material 310 forms the spacing layer 320 on the isolation structure 210. In some embodiments, the self-aligned isolation fins 410 and the hard mask layer 122 on the top of the active fins 120 are slightly etched during the etching of spacing layer material 310, and their top surfaces are still substantially coplanar after the etch back process. This coplanar structure can be achieved by any suitable methods such as, for example, an etch process that has suitable etch selectivity between materials of the spacing layer material 310, the hard mask layer 122 on the top of the active fin 120, and the self-aligned isolation fin 410. For example, the etch process can have a higher etch rate of spacing layer material 310 than the etch rate of self-aligned isolation fins 410 or the hard mask layer 122. In some embodiments, etching rate difference be achieved by adjusting suitable parameters of the etch process such as, for example, etchant gas type, gas flow rate, etching temperature, plasma power, chamber pressure, other suitable parameters, and/or combinations thereof.

In some embodiments, this coplanar structure can be achieved by a CMP process that removes top portions of spacing layer material 310 and self-aligned isolation fins 410 until they are coplanar with the top surfaces of the hard mask layer 122 on the top of the active fins 120. An etching process can then be used to etch back the spacing layer material 310. The etch processes of spacing layer material 310 can be plasma processes such as, for example, an RIE process using fluorine-based plasma. In some embodiments, the RIE etching process may include etchant gas such as, for example, $CF_4$, $CHF_3$, $C_3F_8$, and/or other suitable gases. In some embodiments, etching the spacing layer material 310 includes performing a wet chemical process that etches silicon oxide. Numerous other methods to form recesses can also be suitable.

Figure 6:
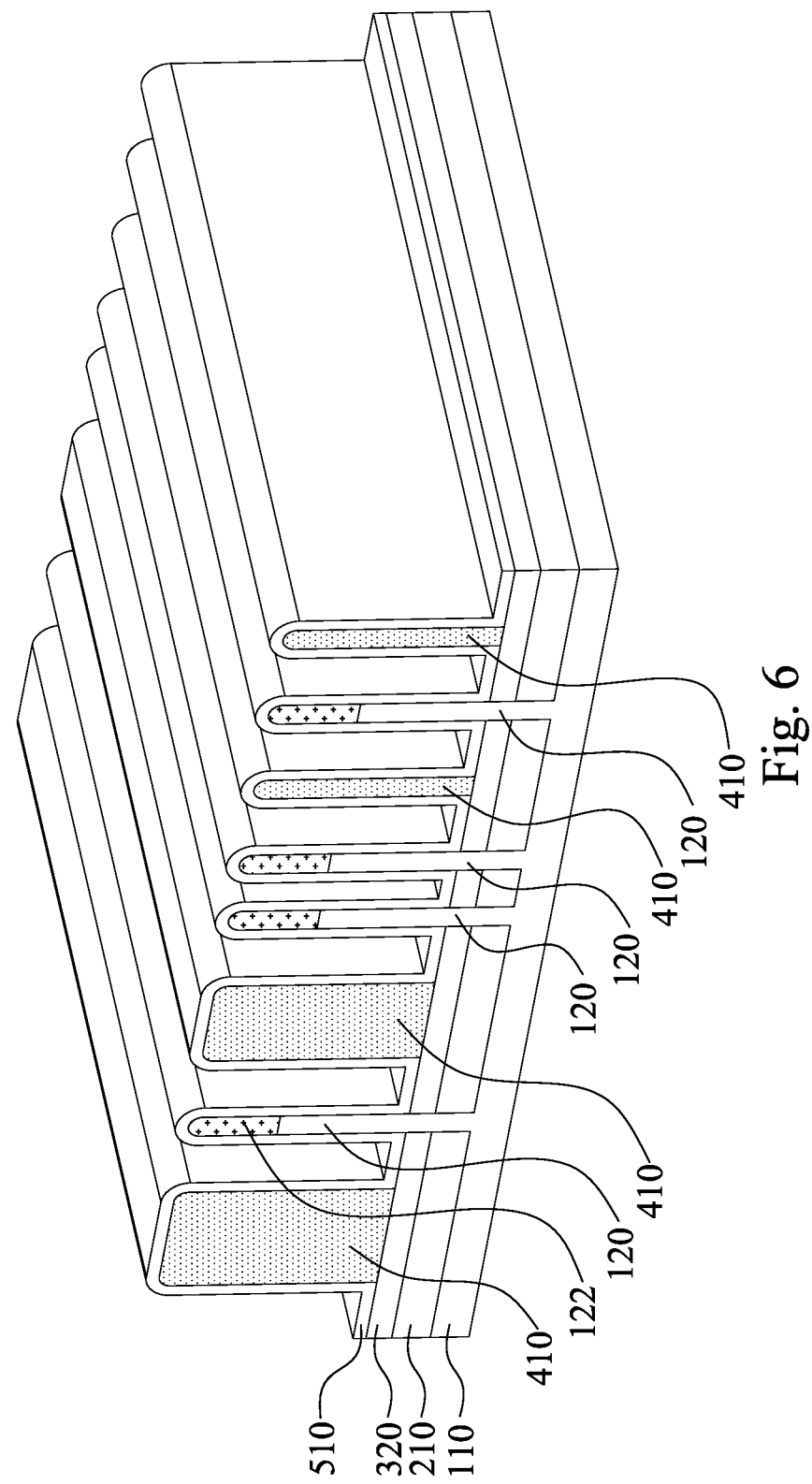

Reference is made to FIG. 6. A dielectric liner 510 is formed on the active fins 120, the hard mask layer 122, the self-aligned isolation fins 410, and the spacing layer 320 through a blanket deposition. In some embodiments, the dielectric liner 510 can be a silicon oxide layer (e.g., silicon dioxide) or a high-k material. In some embodiments, the dielectric liner 510 may include a plurality of layers. In some embodiments, the dielectric liner 510 is deposited using an ALD process or a CVD process.

Figure 7:
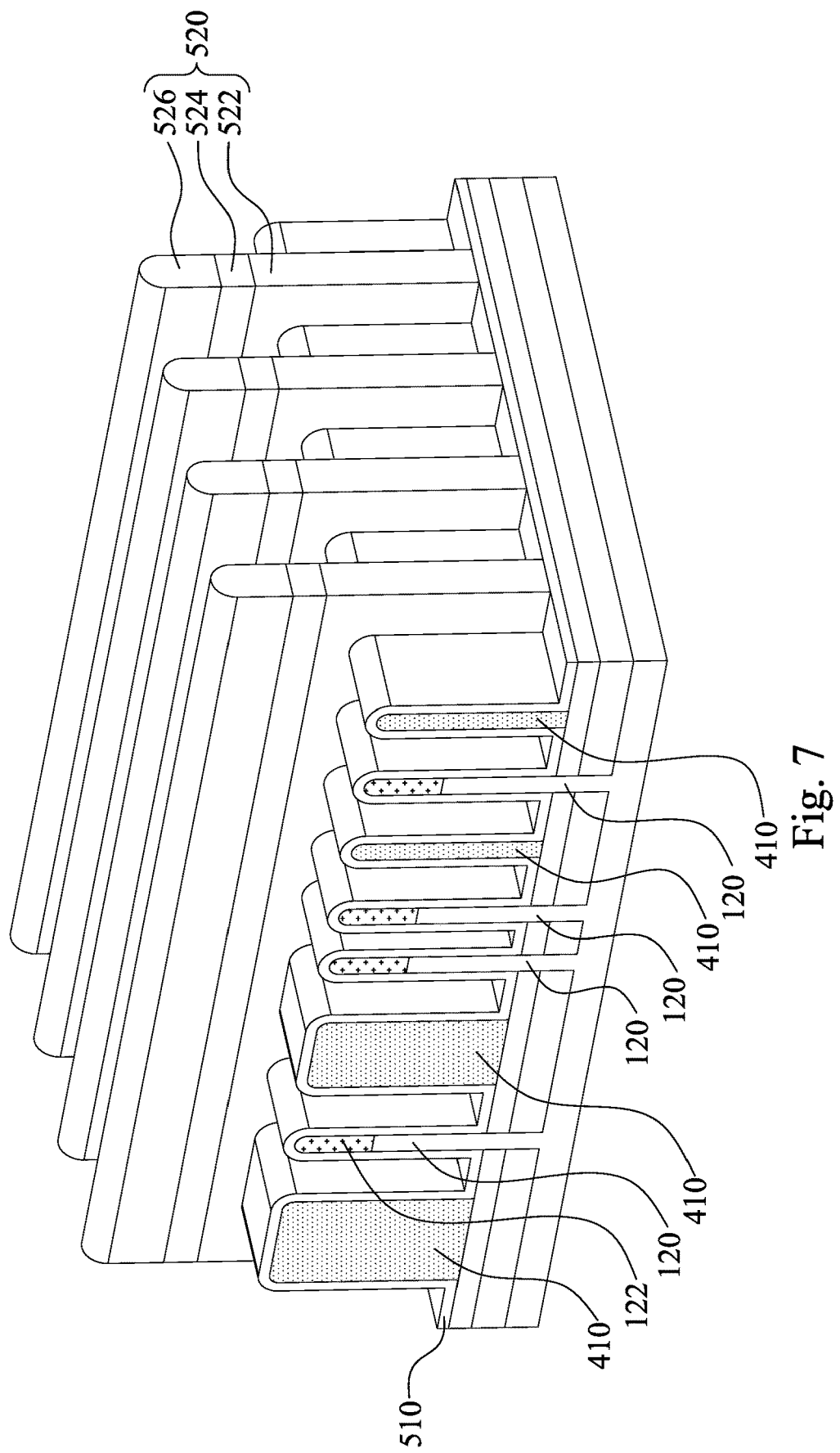

Reference is made to FIG. 7. Sacrificial structures 520 are formed in parallel and extend along a direction that is different from the direction of active fins 120. The sacrificial structures 520 can be uniformly spaced to provide a uniform pattern density and can be formed over and across the top surface and the opposite side surfaces the self-aligned isolation fins 410 and/or the active fins 120. In some embodiments, the sacrificial structures 520 include poly structures 522, first hard masks 524 and second hard masks 526 on the poly structures 522. In some embodiments, the poly structures 522 are made of poly silicon, the first hard masks 524 are made of silicon nitride ($SiN_x$) or silicon carbon nitride (SiCN), and the second hard masks 526 are made of $SiO_x$. In some embodiments, forming sacrificial structures 520 includes depositing a stack of materials including a poly silicon layer, a nitride hard mask layer, and an oxide hard mask layer, patterning the stack using lithography, and etching the stack of materials to form the poly structures 522, the first hard masks 524, and the second hard masks 526. In some embodiments, the etching of the stack of the materials stops on the surface of the dielectric liner 510.

Figure 8:
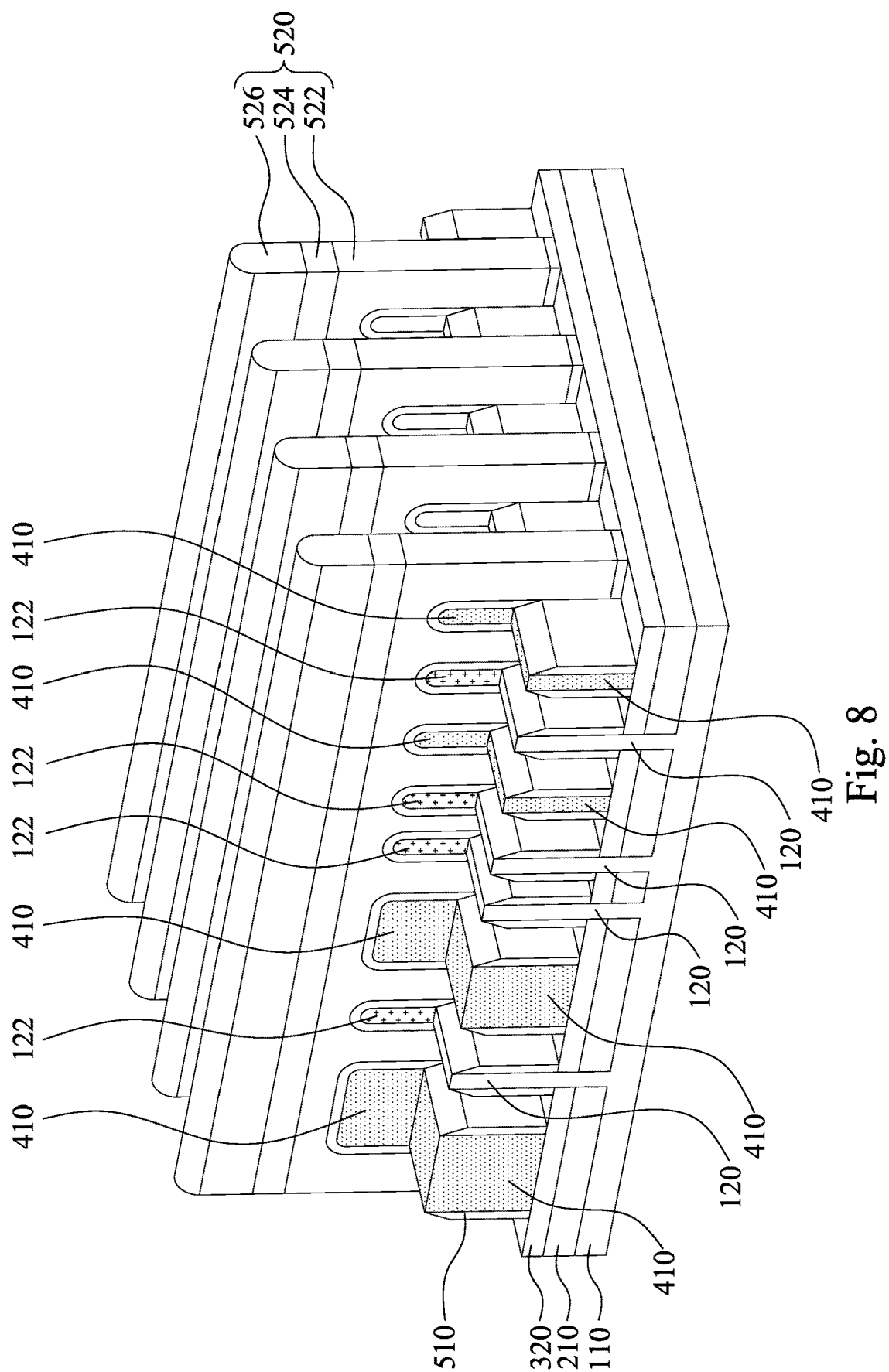

Reference is made to FIG. 8. In some embodiments, a plasma bombardment is performed to recess portions of the hard mask layer 122 on the top of the active fins 120 and portions of the self-aligned isolation fins 410 unprotected by the sacrificial structures 520. In some embodiments, the portions of the hard mask layer 122 on the top of the active fins 120 uncovered by the sacrificial structures 520 are completely removed, and the portions of the hard mask layer 122 on the top of the active fins 120 covered by the sacrificial structures 520 remain under the sacrificial structures 520. Also, the self-aligned isolation fins 410 unprotected by the sacrificial structures 520 are level with the active fins 120 after the recessing process. The portions of the self-aligned isolation fins 410 covered by the sacrificial structures 520 remain under the sacrificial structures 520.

This recessing process can be achieved by any suitable methods. In some embodiments, the spacing layer 320 and the second hard masks 526 remain on the structure after the recessing process by proper selecting material and etchants. In some other embodiments, the spacing layer 320 and the second hard masks 526 also partially removed during the recessing process. After the recessing process, an additional cleaning process is performed to remove the dielectric liner 510.

Figure 9:
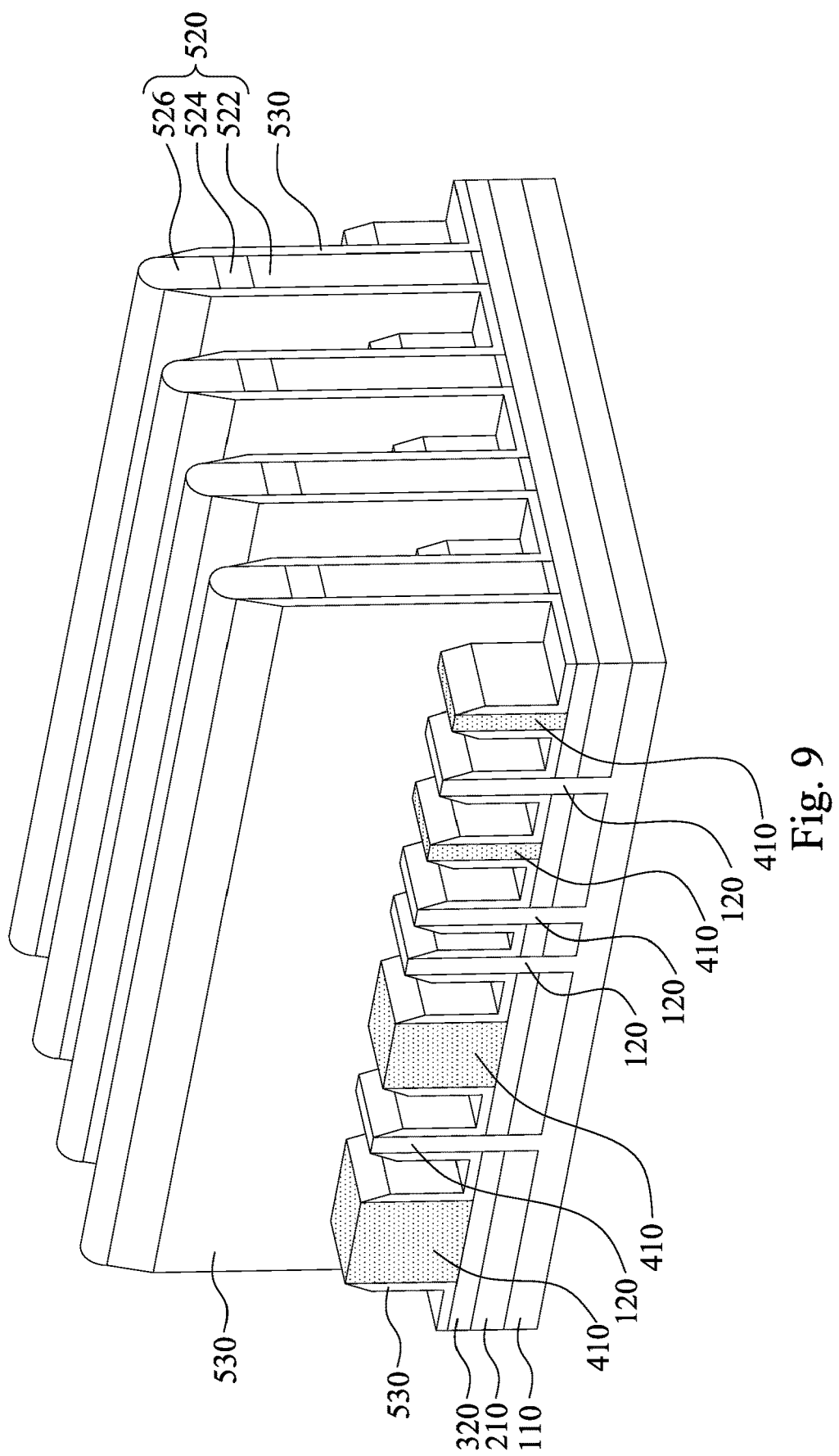

Reference is made to FIG. 9. After the recessing process and the cleaning process, a gate spacer 530 is formed on both side surfaces of sacrificial structures 520. The gate spacer 530 is a low-k spacer with dielectric constant less than 4.0. In some embodiments, the gate spacer 530 includes elements such as, for example, silicon (Si), oxygen (O), and carbon (C). In some embodiments, the material of the gate spacers 530 includes SiOx, SiN, SiCN, SiON, SiOCN, BN, other suitable materials, and the combinations thereof. In some embodiments, forming the gate spacer 530 includes a blanket deposition of a spacer layer followed by pulling back the spacer layer with an etch (e.g., a dry etch) process. In some embodiments, pulling back the spacer layer includes etching and removing the spacer layer deposited over top surfaces of the sacrificial structures 520, the self-aligned isolation fins 410, the active fins 120, and the spacing layer 320.

In some embodiments, the active fins 120 can then be doped with p-type dopants for use in p-type FinFET devices or doped with n-type dopants for use in n-type FinFET devices. In some embodiments, the active fins 120 can have different types of dopants from one another. In some embodiments, the active fins 120 can be doped using the same type of dopants. For example, some active fins 120 can be doped with p-type dopants while some active fins 120 can be doped with n-type dopants, such that semiconductor structure can include both p-type and n-type FinFETs. The active fins 120 with different dopants can be achieved by protecting a first selection of active fins 120 using a photoresist layer formed by a patterning process, and dope the exposed second selection of active fins 120 with a type of dopants. The photoresist layer can then be removed and formed again using a patterning process over the second selection of active fins 120 and exposing the first selection of active fins 120 to a doping process. The doping process can be any suitable doping process such as, for example, an ion implantation process.

Figure 10:
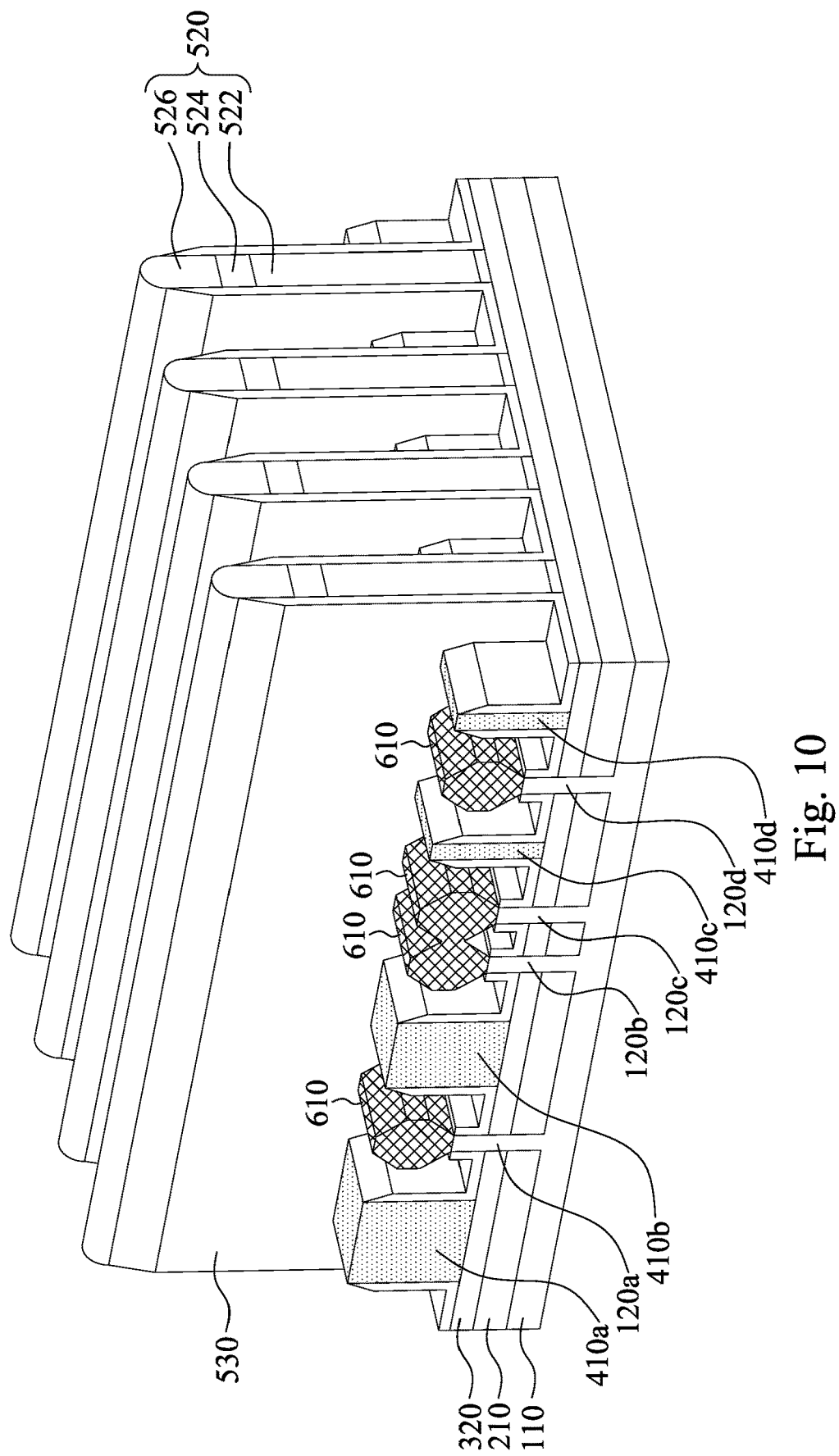

Reference is made to FIG. 10. Epitaxial source/drains 610 are formed on the active fins 120, such as the active fins 120a, 120b, 120c, and 120d. In some embodiments, the active fins 120 are etched back using a suitable etching process such as, for example, a dry RIE etching process. In some embodiments, the top surface of the remaining active fins 120 is higher than the top surface of spacing layer 320. An epitaxy process is then performed to grow epitaxy layers from the top surfaces of active fins 120. The epitaxy process can use the top surfaces of active fins 120 as a seed layer and the growth process continues until a nominal size and/or structure of epitaxial source/drains 610 has been reached. Growing the epitaxy layers on exposed surfaces of active fins 120 can include performing a pre-clean process to remove the native oxide on the surface of active fins 120. Next, an epitaxy process is performed to grow the epitaxy layers on the surfaces of the active fins 120. In some embodiments, the epitaxy process is a SiGe epitaxy process performed at a temperature in a range from about 400° C. to about 500° C. The epitaxy process is a selective process that only grows the epitaxy layer on the exposed surfaces of the active fins 120. In some embodiments, epitaxial source/drains 610 are doped with p-type or n-type dopants during the epitaxy process.

The epitaxial source/drains 610 can also take different shapes depending on various factors such as, for example, the epitaxy process condition, the crystalline orientation of active fins, and/or other suitable factors. In some embodiments, the shape of the epitaxial source/drains 610 is a diamond like shape. An in-situ doping process can also be performed during the epitaxy process. One of functions of the self-aligned isolation fins 410, such as the self-aligned isolation fins 410a, 410b, 410c, and 410d, is for it to serve as a barrier between adjacent epitaxial source/drains 610. For example, epitaxial source/drains 610 growing out of respective active fins 120a and 120b are separated by the self-aligned isolation fin 410b, while epitaxial source/drains 610 growing out of respective active fins 120c and 120d are separated by self-aligned isolation fin 410c. Therefore, the self-aligned isolation fins prevents unwanted epi-bridging between formed epitaxial source/drains 610. On the other hand, the epitaxial source/drains 610 growing out of respective active fins 120b and 120c are merged. The width of the self-aligned isolation fins 410a, 410b, 410c, and 410d are determined according to different layout requirements of the logic devices.

Figure 11:
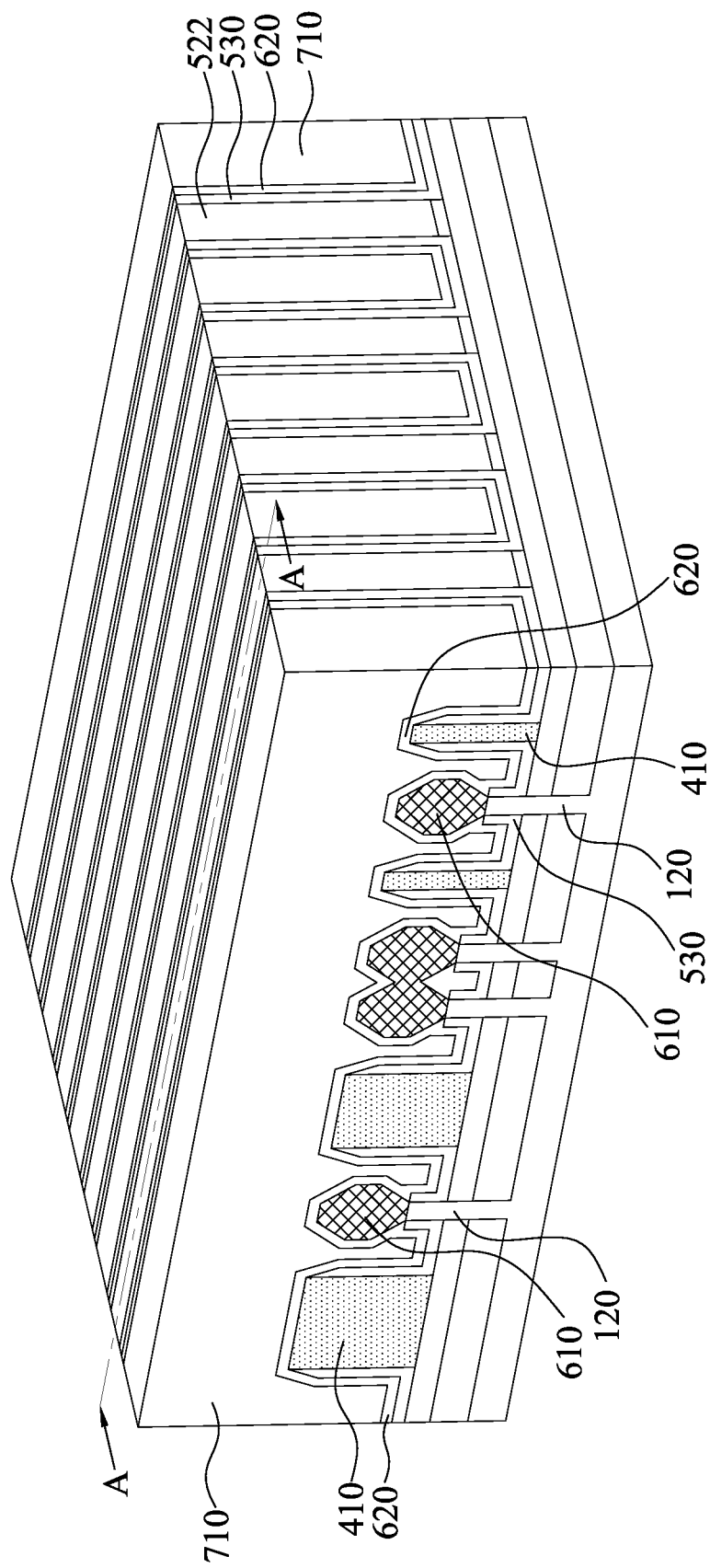

Reference is made to FIG. 11. A contact etch stop layer 620 can be deposited over epitaxial source/drains 610 and/or self-aligned isolation fins 410 of the semiconductor structure as described above. The contact etch stop layer 620 can be used to protect epitaxial source/drains 610 against moisture, dopants, and/or oxidation during subsequent processes. For example, the contact etch stop layer 620 can protect epitaxial source/drains 610 from oxidation during the subsequent interlayer dielectric layer deposition. In some embodiments, the contact etch stop layer 620 can act as an etch stop layer for the subsequent contact etch so that epitaxial source/drains 610 or self-aligned isolation fins 410 below the contact etch stop layer 620 are not damaged by the contact etch. In some embodiments, the contact etch stop layer 620 can be a silicon nitride layer. In some embodiments, depositing contact etch stop layer 620 can be performed using an ALD process, a CVD process, other suitable processes, and/or combinations thereof.

An interlayer dielectric layer 710 can be formed using a blanket deposition followed by a planarization process to remove the excess interlayer dielectric material that is formed over the sacrificial structures 520 (see FIG. 10). In some embodiments, the interlayer dielectric layer 710 is an oxide (e.g., SiOx) layer. In some embodiments, the interlayer dielectric layer 710 is deposited using a CVD process, an ALD process, an FCVD process, a spin-on process, other suitable processes, and/or combinations thereof. In some embodiments, an additional anneal process performed at a temperature in a range from about 400° C. to about 600° C. can be used to treat the interlayer dielectric layer 710 to densify the as-deposited dielectric layer. In some embodiments, after depositing the interlayer dielectric layer 710, a planarization process (e.g., CMP) is performed to remove portions of the interlayer dielectric layer 710 that is formed over the top surfaces of sacrificial structures 520. The planarization process can be performed such that the top surfaces of the interlayer dielectric layer 710, the gate spacer 530, and the poly structures 522 are coplanar. In some embodiments, the first hard masks 524 and the second hard masks 526 are also removed during the planarization process or during an additional etch process, so that the top surfaces of poly structures 522 is exposed.

In some embodiments, the processes for forming source/drain contacts are sequentially performed. For example, portions of the interlayer dielectric layer are removed to form contact holes to expose the epitaxial source/drains. The silicide contacts can be further formed on the exposed surface of the epitaxial source/drains. Then one or more filling materials are deposited to fill the contact openings, such that the metal contacts are embedded in the interlayer dielectric layer and connected to the epitaxial source/drains. Details of above processes are not described herein.

Figure 12:
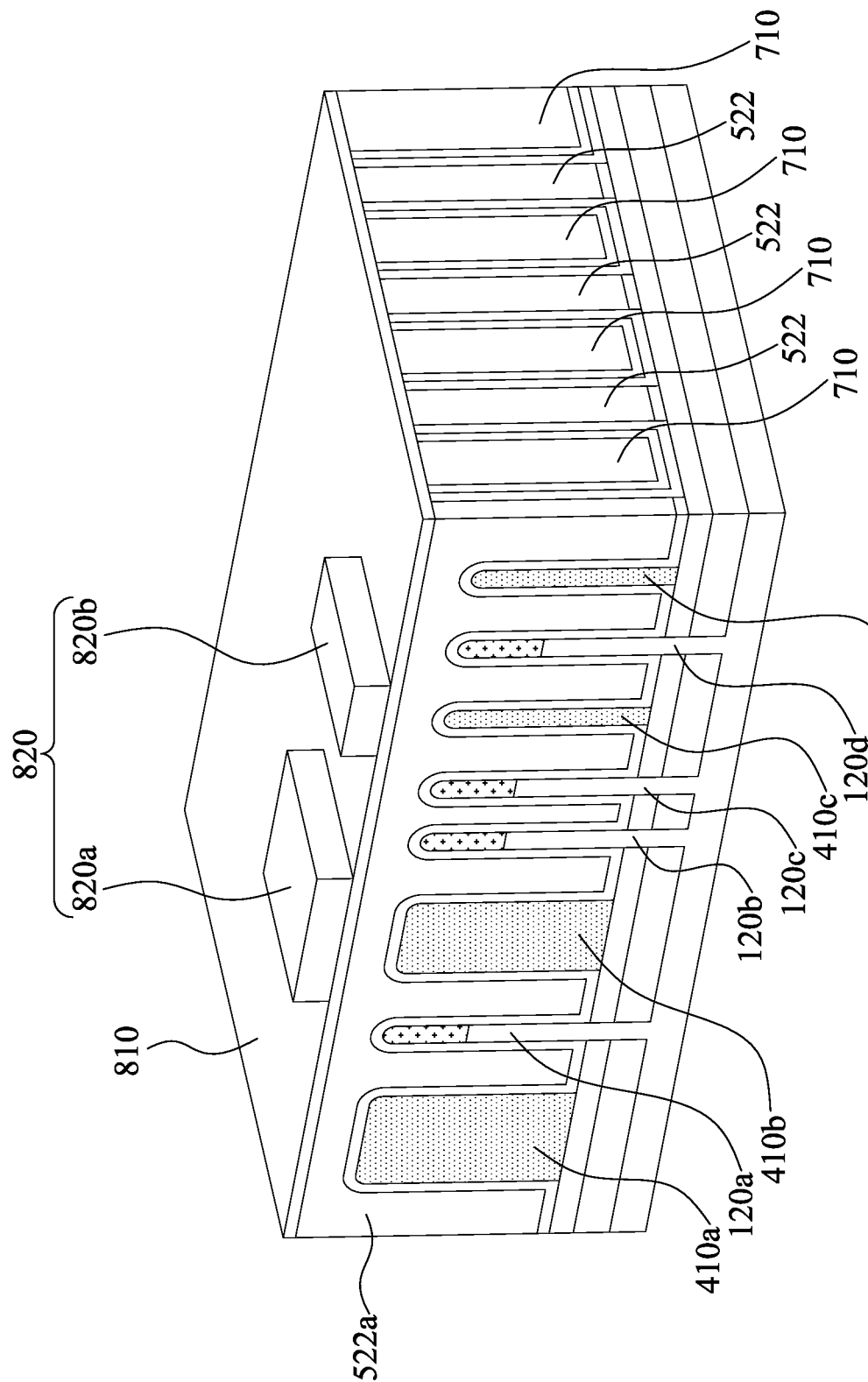

Reference is made to FIG. 12. Unlike previous figures, the front plane of the semiconductor structure is cut along the line A-A in FIG. 11, in the following figures. The portions of the active fin 120 and the portions of the self-aligned isolation fins 410 are disposed under the poly structures 522. A thin dielectric layer 810 is formed on the top surface of the semiconductor structure, and one or more mask patterns 820 are formed on thin dielectric layer 810. The mask patterns 820 are formed covering one or more self-aligned isolation fins 410 and across at least one of the poly structures 522. The position of the mask patterns 820 are designed corresponding to the layout requirement, such as the positions of cut-openings. For example, the mask pattern 820a is formed covering the self-aligned isolation fins 410b and the poly structure 522a. The mask pattern 820b is formed covering the self-aligned isolation fins 410c and the poly structure 522a. The active fins 120a-120d are all free from coverage of the mask patterns 820. After the mask patterns 820 are formed, sequential processes are performed to pattern the self-aligned isolation fins 410, and then gate replacement processes are performed.

Figure 13A:
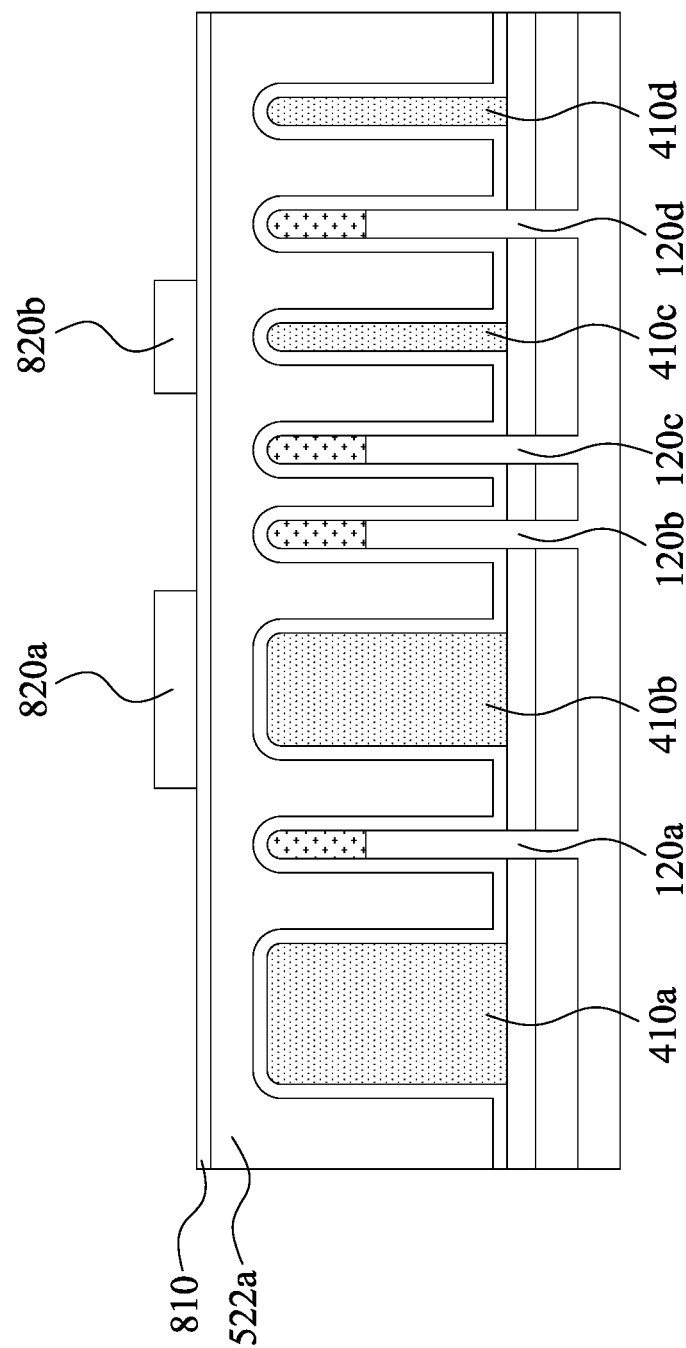
FIGS. 13A-13E are cross-sectional view of intermediate processes of patterning the self-aligned isolation fins and gate replacement, according to some embodiments of the disclosure.

Reference is made to FIGS. 13A-13E, in which FIGS. 13A-13E are cross-sectional view of intermediate processes of patterning the self-aligned isolation fins 410 and gate replacement, according to some embodiments of the disclosure. FIGS. 13A-13E are cross-sectional views taken along line A-A of FIG. 11. Referring to FIG. 13A, the self-aligned isolation fins 410a-410d and the active fins 120a-120d are arranged on the substrate 110. The poly structures, including the poly structure 522a, are formed surrounding the self-aligned isolation fins 410a-410d and the active fins 120a-120d, and the top surfaces of the poly structure 522a and the interlayer dielectric layer 710 (see FIG. 12) are planarized. The thin dielectric layer 810 is formed on the top surface of the poly structure 522a and the interlayer dielectric layer 710. The mask pattern 820a is formed on the self-aligned isolation fin 410b, and the mask pattern 820b is formed on the self-aligned isolation fin 410c. The self-aligned isolation fins 410a, 410d, and the active fins 120a-120d are free from coverage by the mask patterns.

Figure 13B:
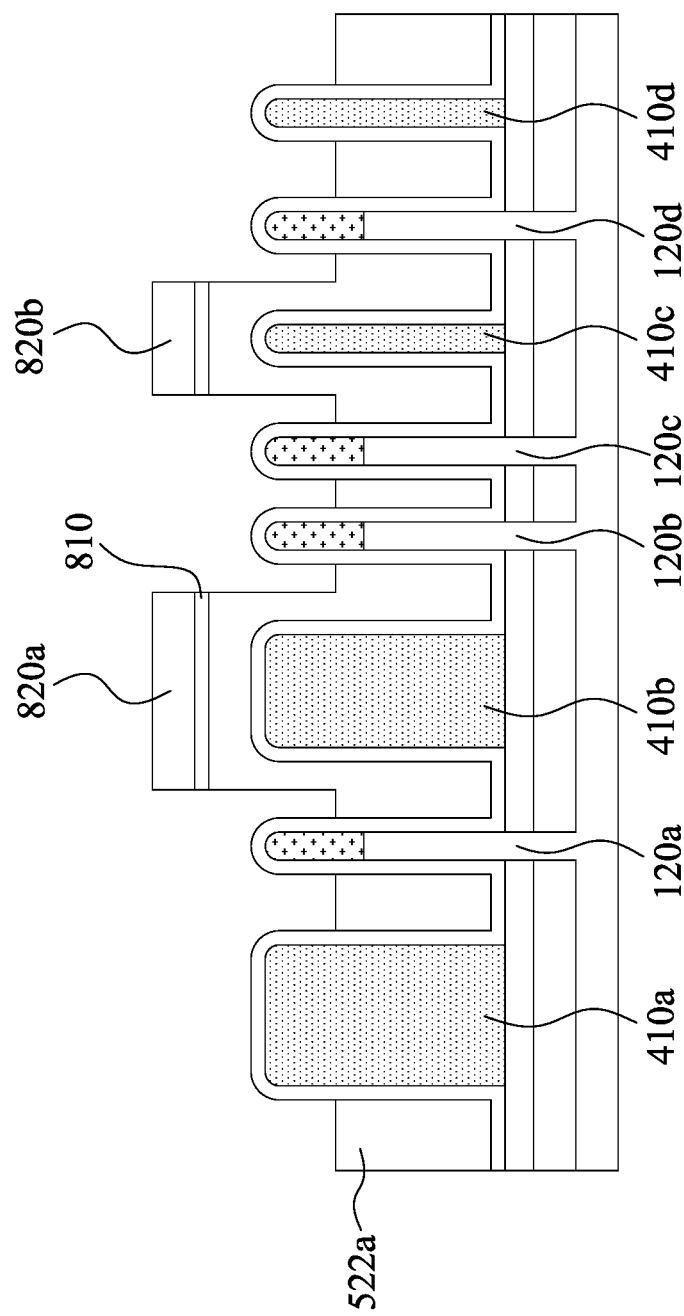

Referring to FIG. 13B, a first recessing process is performed to remove portions of the poly structure 522a that are uncovered by the mask patterns 820a, 820b. The top surface of recessed portions of the poly structure 522a is lower than the self-aligned isolation fins 410a-410d and the active fins 120a-120d. The self-aligned isolation fins 410a-410d and the active fins 120a-120d are protected by the dielectric liner 510 and are protruded from the recessed portion of the poly structure 522a. The first recessing process can be performed by one or more etching processes including using etchant that has high selectivity between oxide, e.g. the dielectric liner 510, and the silicon, e.g. the poly structure 522a.

Figure 13C:
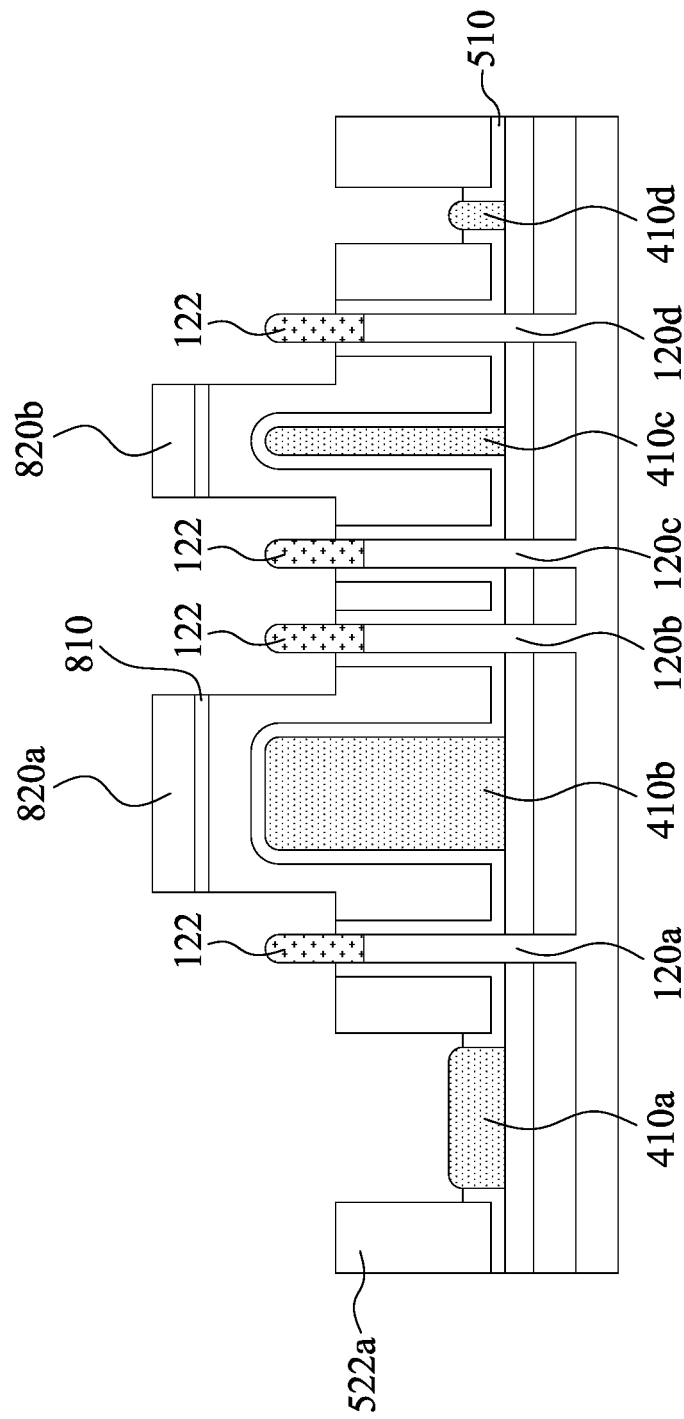

Referring to FIG. 13C, a second recessing process is performed to remove portions of the self-aligned isolation fins, such as self-aligned isolation fins 410a, 410d that are not covered by the mask patterns 820a, 820b. In some embodiments, the active fins 120a-120d are also exposed by the mask patterns 820a, 820b, and the hard mask layer 122 protects the underlying active fins 120a-120d during the second recessing process. The material of the hard mask layer 122 is different from the self-aligned isolation fins 410a-410d, such that the etchant utilized in the second recessing process may have suitable etch selectivity between materials of the self-aligned isolation fins and material of the mask patterns 820a, 820b and the hard mask layer. For example, the etch process of the second recessing process can have a higher etch rate of self-aligned isolation fins 410a, 410d than the etch rate of the hard mask layer 122. In some embodiments, the material of the self-aligned isolation fins 410a-410d includes oxide, and the material of the mask patterns 820a, 820b and hard mask layer 122 includes nitride. In some embodiments, the dielectric liner 510 is made of oxide and is also removed during the second recessing process.

Figure 13D:
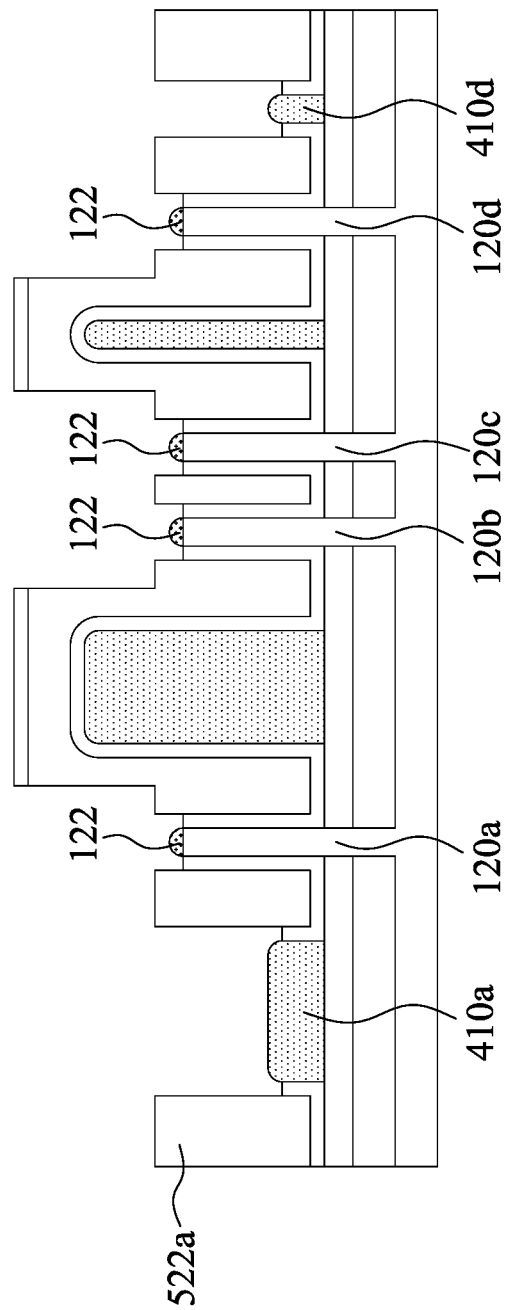

Referring to FIG. 13D, a third recessing process is performed to remove the mask patterns 820a, 820b (see FIG. 13C). The hard mask layer 122 on the active fins 120a-120d are also removed simultaneously because the hard mask layer 122 and the mask patterns 820a, 820b are made of similar material. However, the thickness of the hard mask layer 122 is greater than the thickness of the mask patterns 820a, 820b. Therefore, portions of the hard mask layer 122 still remain on the active fins structures 120a-120d to protect the active fins 120a-120d in the following processes. Unlike the second recessing process, the etch process of the third recessing process has a higher etch rate of the hard mask layer 122 and the mask patterns 820a, 820b than the etch rate of the self-aligned isolation fins 410a, 410d. In some embodiment, the sequence of the second recessing process and the third recessing process can be interchanged.

Figure 13E:
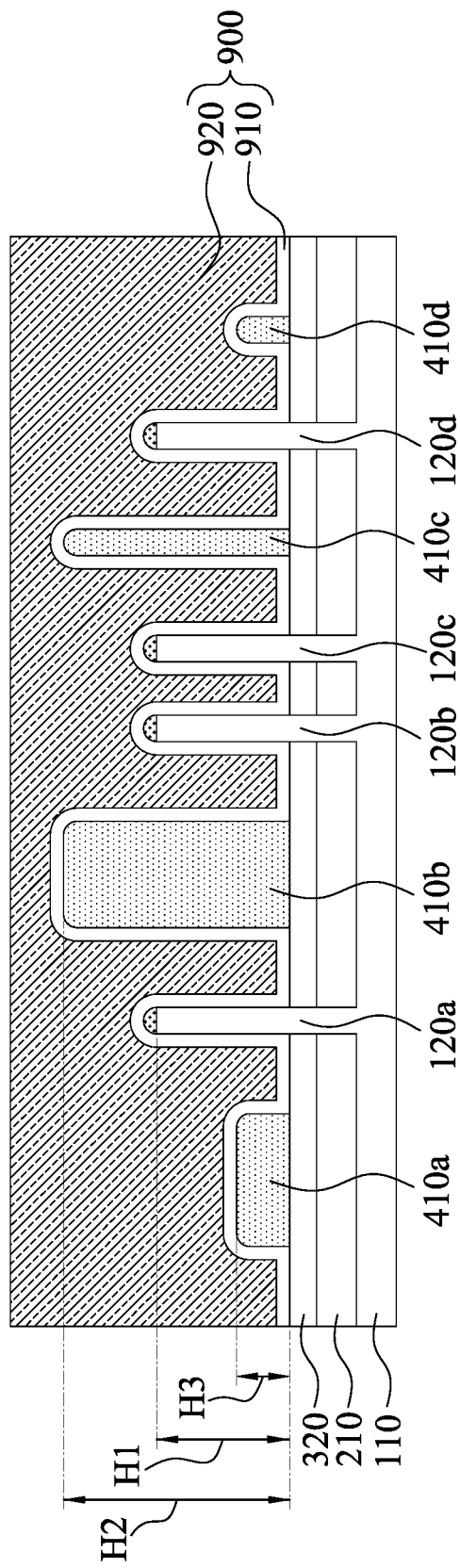

Referring to FIG. 13E, a gate replacement process is performed to replace the poly structures 522 (see FIG. 11), including the poly structure 522a shown in FIG. 13D with metal gate structures 900. First, the poly structures 522 can be removed using a dry etch, a wet etch, or a combination thereof. Second, metal gate electrodes are deposited into the openings. In some embodiments, the process used to remove poly structures 522 is selective such that interlayer dielectric layer 710 (see FIG. 11) and the gate spacer 530 (see FIG. 11) remain after the etch process. Therefore, the removal of poly structures 522 can form openings between opposing gate spacers 530.

In some embodiments, removing the poly structure 522 can also include removing the dielectric liner 510 such that a gate dielectric layer 910 can be formed before forming metal gate electrodes 920 in the openings. In some embodiments, the gate dielectric layer 910 can include an interfacial layer and a high-k dielectric layer. In some embodiments, the interfacial layer is a SiOx layer. In some embodiments, the high-k dielectric layer includes a high-k dielectric material such as, for example, hafnium oxide, lanthanum oxide, aluminum oxide, zirconium oxide, silicon nitride, or other suitable high-k materials. In some embodiments, the dielectric constant of the high-k dielectric layer is higher than about 3.9. In some embodiments, the dielectric constant of the high-k dielectric layer is higher than about 7.0. In some embodiments, forming the gate dielectric layer 910 is performed using an ALD process, a CVD process, other suitable deposition processes, and/or combinations thereof.

In some embodiments, the metal gate electrodes 920 can include a metal conductor such as tungsten, titanium, tantalum, copper, titanium nitride, tantalum nitride, molybdenum, other suitable metal or metal alloys, and/or combinations thereof. In some embodiments, the metal gate electrodes 920 can also include a diffusion barrier such as, for example, titanium nitride (TiN) and titanium silicon nitride (TiSiN). In some embodiments, the metal gate electrodes 920 can further include a work-function layer such as, for example, TiN and titanium aluminum (TiAl) for n-type FinFET devices and tantalum nitride (TaN) and TiAl for p-type FinFET devices. In some embodiments, forming the metal gate electrodes 920 can be performed using an ALD process, a CVD process, other suitable deposition processes, and/or combinations thereof.

After the metal gate structures 900 are filled in the openings, the self-aligned isolation fins 410a-410d below the metal gate structures 900 have more than one heights. For example, the active fins 120a-120d have substantially the same first height H1 protruding from the top surface of the spacing layer 320. The self-aligned isolation fins 410b, 410c are protected by mask patterns during the recessing processes, and thus the self-aligned isolation fins 410b, 410c are not recessed and have a second height H2 that is higher than the first height H1. The self-aligned isolation fins 410a, 410d are exposed from the mask patterns and are recessed during the recessing processes, and thus the self-aligned isolation fins 410b, 410c have a third height H3 that is shorter than the first height H1. Therefore, the thickness of the metal gate structures 900 over the self-aligned isolation fins 410a, 410d is higher than the thickness of the metal gate structures 900 over the self-aligned isolation fins 410b, 410c and the active fins 120a-120d. The volume of the metal gate structures 900 filling in the openings can be increased, and the resistance of the metal gate structures 900 can be reduced accordingly.

Figure 14:
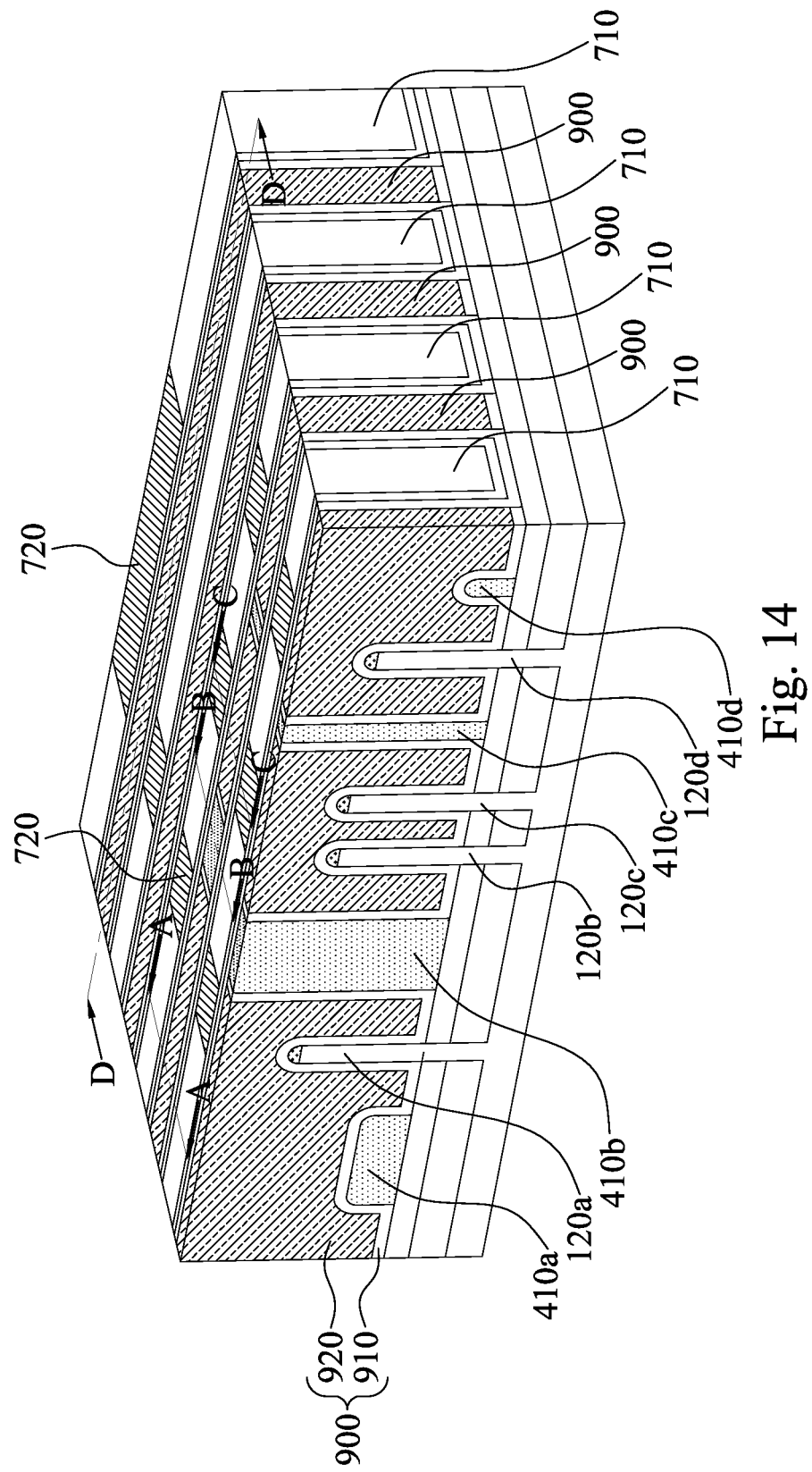
FIG. 14 is an oblique view of an embodiment of the semiconductor structure of the disclosure.

Reference is made to FIG. 14. FIG. 14 is an oblique view of an embodiment of the semiconductor structure of the disclosure. In some embodiments, after forming metal gate structures 900 in the openings, as shown in FIG. 13E, a planarization process (e.g., a CMP process) is performed to planarize the top surfaces of the semiconductor structure. In some embodiments, the planarization process continues until the top surfaces of interlayer dielectric layer 710, the gate dielectric layer 910, the gate spacers 530, the metal gate electrodes 920, and the self-aligned isolation fins 410b, 410c are substantially coplanar. That is, portions of the self-aligned isolation fins 410b, 410c are removed in the planarization process, and the self-aligned isolation fins 410b, 410c are exposed from the metal gate structures 900. In some embodiments, at least one of the metal gate structures 900 is separated by the self-aligned isolation fins 410b, 410c, thus the self-aligned isolation fins 410b, 410c serve as cut polysilicon (CPO) patterns. In some embodiments, the self-aligned isolation fins 410a, 410d that have shorter heights are covered by the metal gate structures 900 and serve as dummy fins for layout considerations.

In some embodiments, sequential processes of forming the source/drain contacts are performed to form a plurality of source/drain contacts 720 in the interlayer dielectric layer 710. The source/drain contacts 720 can be formed in interlayer dielectric layer 710 and over the epitaxial source/drains 610 (see FIG. 9). Patterning and etching processes can be used to form openings in interlayer dielectric layer 710 for deposition of source/drain contact material, such as Co, W, Ru, Cu, or combinations thereof. The source/drain contacts 720 can be formed after the planarization process, and the top surfaces of the source/drain contacts 720, the interlayer dielectric layer 710, and the metal gate electrodes 920 are coplanar. In some embodiments, the source/drain contacts 720 can further include a barrier layer to avoid diffusion of materials from source/drain contacts into interlayer dielectric layer 710, or vice versa. In some embodiments, forming source/drain contacts 720 can further include forming a silicide layer between the source/drain contacts 720 and the epitaxial source/drains 610. In some embodiments, an additional etch is performed to recess the top surfaces of the epitaxial source/drains 610 to form a flat surface for the source/drain contacts 720. In some embodiments, recessing the epitaxial source/drains 610 increases the contact area between the source/drain contacts 720 and epitaxial source/drains 610 which can reduce contact resistance.

Figure 15C:
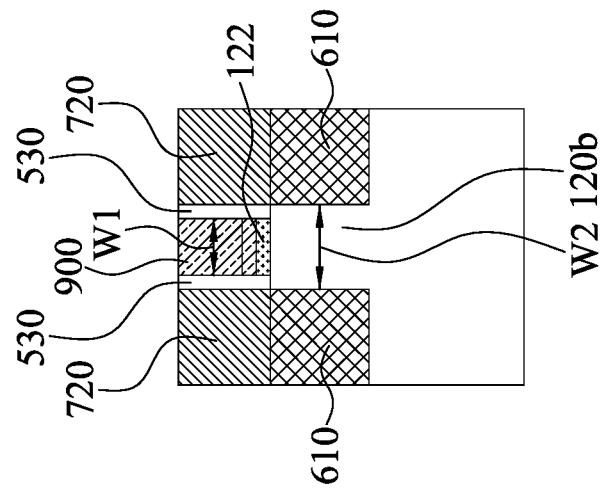
FIGS. 15A-15D are cross-sectional views of the embodiment of the semiconductor structure of the disclosure.
Figure 15B:
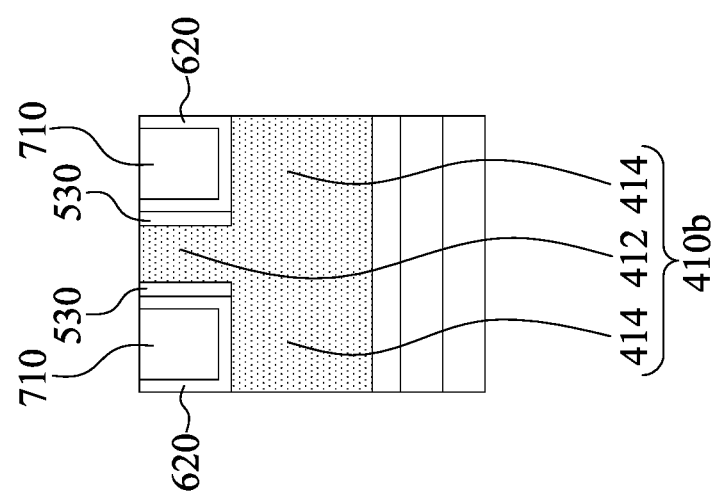
Figure 15A:
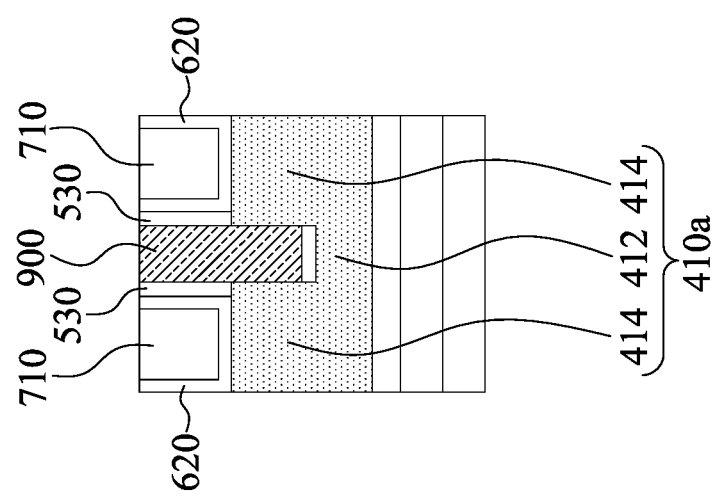
Figure 15D:
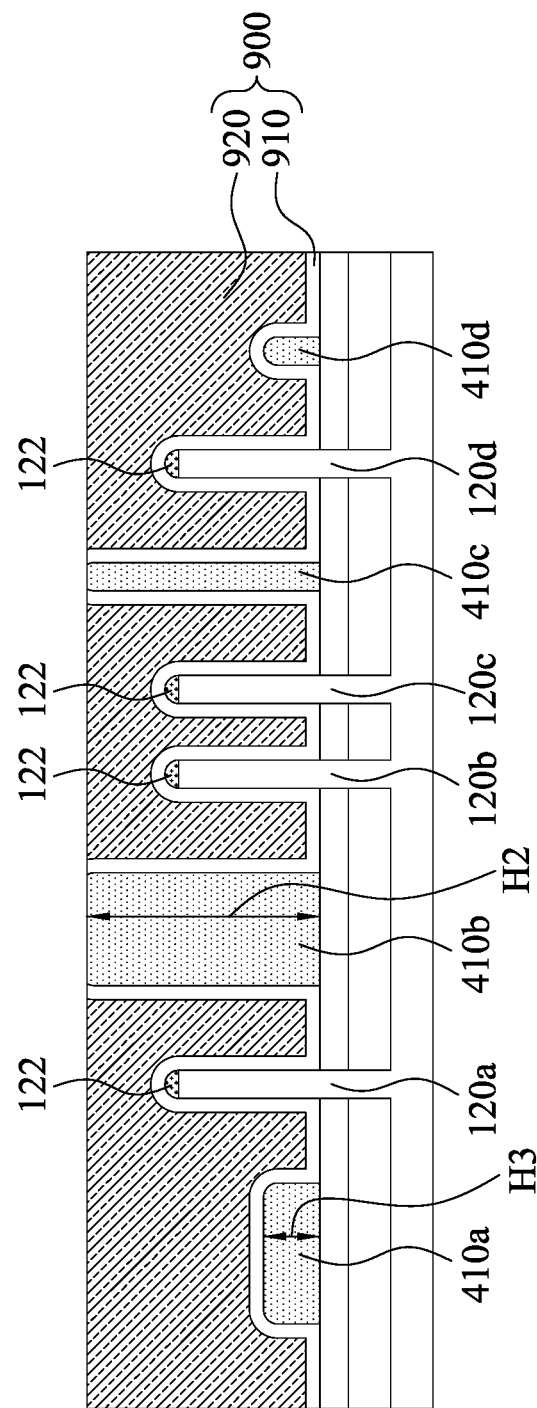

Reference is made to FIGS. 15A-15D, which are cross-sectional views of the embodiment of the semiconductor structure of the disclosure. FIG. 15A is a cross-sectional view taken along line A-A in FIG. 14. FIG. 15B is a cross-sectional view taken along line B-B in FIG. 14. FIG. 15C is a cross-sectional view taken along line C-C in FIG. 14. FIG. 15D is a cross-sectional view taken along line D-D in FIG. 14.

Referring to FIG. 15A, the portion of the semiconductor structure with the self-aligned isolation fin 410a is shown. The self-aligned isolation fin 410a serves as dummy fin, and the metal gate structure 900 is disposed on the self-aligned isolation fin 410a. The self-aligned isolation fin 410a has a first portion 412 covered by the metal gate structure 900 and two second portions 414 disposed at opposite sides of the first portion 412. The interlayer dielectric layer 710 and the gate spacers 530 are disposed on opposite sides of the metal gate structure 900 and on the second portions 414, respectively. The top surfaces of the interlayer dielectric layer 710, the gate spacers 530, and the metal gate structure 900 are coplanar, and the gate spacers 530 are interposed between the metal gate structure 900 and the interlayer dielectric layer 710.

In some embodiments, the contact etch stop layer 620 is present between the gate spacers 530 and the interlayer dielectric layer 710, and the contact etch stop layer 620 wraps the sidewalls and the bottom surface of the interlayer dielectric layer 710. The contact etch stop layer 620 is disposed between the top surface of the second portions 414 of the self-aligned isolation fin 410a and the interlayer dielectric layer 710.

The height difference between the first portion 412 and the second portions 414 is depend on the recess processes as illustrated in FIGS. 13A-13E. For example, the first portion 412 can be shorter than the second portions 414 in some embodiments. Or, the first portion 412 can be higher than the second portions 414 in some other embodiments.

In this embodiment, the first portion 412 is shorter than the second portions 414. The gate spacers 530 are disposed on and in contact with the sidewalls of the metal gate structure 900. The depth of the metal gate structure 900 in the semiconductor structure is deeper than the depth of the gate spacers 530. The interface between the metal gate structure 900 and the self-aligned isolation fin 410a is lower than the interface between the interlayer dielectric layer 710 and the self-aligned isolation fin 410a, i.e. the bottom surface of the metal gate structure 900 is lower than the bottom surface of the interlayer dielectric layer 710. The interface between the metal gate structure 900 and the self-aligned isolation fin 410a is lower than the interface between the gate spacers 530 and the self-aligned isolation fin 410a, i.e. the bottom surface of the metal gate structure 900 is lower than the bottom surface of the gate spacers 530.

Referring to FIG. 15B, the portion of the semiconductor structure with the self-aligned isolation fin 410b is shown. The self-aligned isolation fin 410b serves as cut polysilicon (CPO) pattern, and the metal gate structure (see FIG. 14) is separated by the self-aligned isolation fin 410b. The self-aligned isolation fin 410b has a first portion 412 and two second portions 414 disposed at opposite sides of the first portion 412. The interlayer dielectric layer 710 and the gate spacers 530 are disposed on the second portions 414, respectively. The top surfaces of the interlayer dielectric layer 710 and the gate spacers 530 are coplanar, and the gate spacers 530 are interposed between the sidewalls of the first portion 412 of the self-aligned isolation fin 410b and the interlayer dielectric layer 710. The gate spacers 530 are disposed on and in contact with the sidewalls of the first portion 412 of the self-aligned isolation fin 410b. The contact etch stop layer 620 is present between the gate spacers 530 and the interlayer dielectric layer 710.

Referring to FIG. 15C, the portion of the semiconductor structure with the active fin such as the active fin 120b is shown. The hard mask layer 122 remains on the active fin 120b. The metal gate structure 900 is disposed on the hard mask layer 122 and the active fin 120b. The active fin 120b under the metal gate structure 900 serves as channel region. The epitaxial source/drains 610 are disposed at opposite sides of the active fin 120b and are not covered by the metal gate structure 900. The source/drain contacts 720 (or the interlayer dielectric layer 710, in some embodiments) are disposed on the epitaxial source/drains 610 and at opposite sides of the metal gate structure 900 and the hard mask layer 122. The gate spacers 530 are disposed on the sidewalls of the metal gate structure 900 and the hard mask layer 122 and are in contact with the source/drain contacts 720 (or the interlayer dielectric layer 710, in some embodiments). The top surfaces of the metal gate structure 900, the source/drain contacts 720 (or the interlayer dielectric layer 710, and the gate spacers 530 are coplanar.

In some embodiments, the width W1 of the metal gate structure 900 and the hard mask layer 122 is smaller than the width W2 of the active fin 120b. The gate spacers 530 are on the sidewalls of the metal gate structure 900 and the hard mask layer 122 and on the top surface of the active fin 120b. In some embodiments, the interface between the metal gate structure 900 and the hard mask layer 122 is higher than the interface between the gate spacers 530 and the active fin 120b, i.e. the bottom surface of the metal gate structure 900 is higher than the bottom surface of the gate spacers 530. The bottom surfaces of the source/drain contacts 720 are in contact with the epitaxial source/drains 610, and the sidewalls of the source/drain contacts 720 are in contact with the gate spacers 530.

Referring to FIG. 15D, FIG. 15D is a cross-sectional view of the semiconductor structure taken along the metal gate structure 900. The active fins 120a-120d are covered by the metal gate structure 900 including the gate dielectric layer 910 and the metal gate electrode 920. The hard mask layer 122 remains between the active fins 120a-120d and the metal gate structure 900 at the cross-section taken along the metal gate structure 900. The heights H3 of the self-aligned isolation fins 410a and 410d are shorter than the heights H2 of the self-aligned isolation fins 410b and 410c. The self-aligned isolation fins 410a and 410d are covered by the metal gate structure 900 including the gate dielectric layer 910 and the metal gate electrode 920. On the other hand, the top surfaces of the self-aligned isolation fins 410b and 410c are not covered by the metal gate structure 900, and the sidewalls of the self-aligned isolation fins 410b and 410c are deposited with the gate dielectric layer 910. The self-aligned isolation fins 410b and 410c serve as CPO in the metal gate structure 900.

Figure 16:
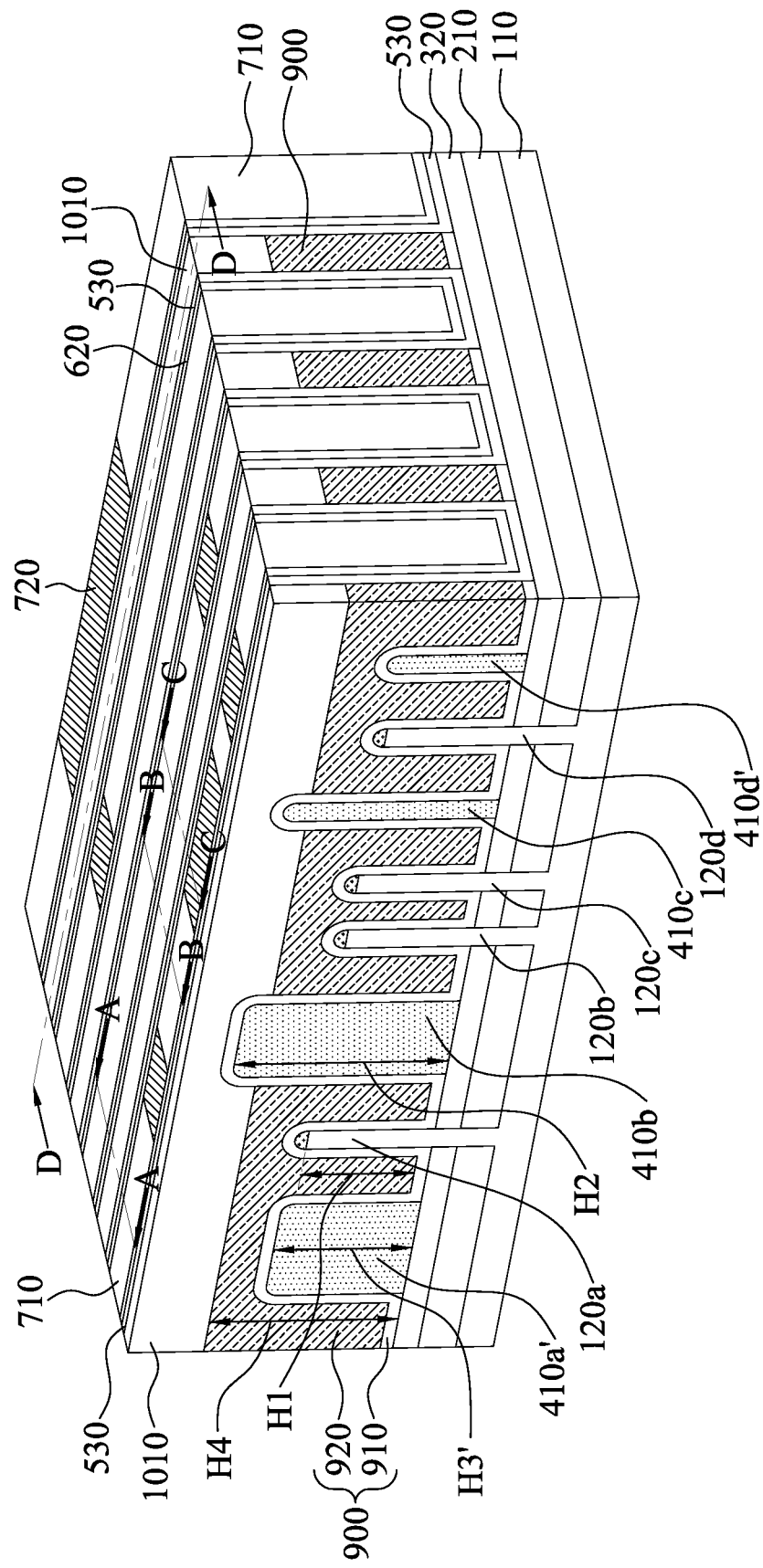
FIG. 16 is an oblique view of yet another embodiment of the semiconductor structure of the disclosure.

Reference is made to FIG. 16. FIG. 16 is an oblique view of yet another embodiment of the semiconductor structure of the disclosure. In some other embodiments of the disclosure, after the step of forming the metal gate structures 900 in the openings, as shown in FIG. 13E, an etch back process is performed to remove portions of the metal gate structures 900. As a result, the metal gate structures 900 have a fourth height H4 after the etch back process. The fourth height H4 of the metal gate structures 900 is shorter than the second height H2 of the self-aligned isolation fins 410b and 410c such that the self-aligned isolation fins 410b and 410c are protruded from the metal gate structures 900 and serve as CPO. The fourth height H4 of the metal gate structures 900 is greater than the first height H1 of the active fins 120a-120d. The fourth height H4 of the metal gate structures 900 is greater than the third height H3' of the self-aligned isolation fins 410a' and 410d'. The third height H3' of the self-aligned isolation fins 410a' and 410d' is similar to the first height H1 of the active fins 120a-120d and is shorter than the second height H2 of the self-aligned isolation fins 410b and 410c. That is, the recessing processes performed in FIGS. 13A-13E for the structure of FIG. 16 remove less self-aligned isolation fins 410a' and 410d' than that in FIG. 14. The fourth height H4 of the metal gate structures 900 can be controlled by suitable parameters, such as adjusting the etching time in the etch back process.

A self-align-contact (SAC) layer 1010 is formed on the metal gate structures 900, and then a planarization process such as a CMP process is performed to flatten the top surfaces of the SAC layer 1010, the gate spacers 530, and the interlayer dielectric layer 710. In some embodiments, the material of the SAC layer 1010 includes SiCN, SiN, SiOx, SiON, SiOCN, BN or metal oxides such as, for example, hafnium oxide ($HfO_2$), zirconium oxide ($ZrO_2$), aluminum oxide ($Al_2O_3$), other suitable metal oxides, and/or combinations thereof.

In some embodiments, sequential processes of forming the source/drain contacts are performed to form a plurality of source/drain contacts 720 in the interlayer dielectric layer 710. The source/drain contacts 720 can be formed in interlayer dielectric layer 710 and over the epitaxial source/drains 610 (see FIG. 9). Selectively etching processes can be used to form openings in interlayer dielectric layer 710 for deposition of source/drain contact material such as Co, W, Ru, Cu, or combinations thereof. The source/drain contacts 720 can be formed after the planarization process, and the top surfaces of the source/drain contacts 720, the interlayer dielectric layer 710, and the SAC layer 1010 are coplanar. In some embodiments, the source/drain contacts 720 can further include a barrier layer to avoid diffusion of materials from source/drain contacts into interlayer dielectric layer 710, or vice versa. In some embodiments, forming source/drain contacts 720 can further include forming a silicide layer between the source/drain contacts 720 and the epitaxial source/drains 610. In some embodiments, an additional etch is performed to recess the top surfaces of the epitaxial source/drains 610 to form a flat surface for the source/drain contacts 720. In some embodiments, recessing the epitaxial source/drains 610 increases the contact area between the source/drain contacts 720 and epitaxial source/drains 610 which can reduce contact resistance.

Figure 17C:
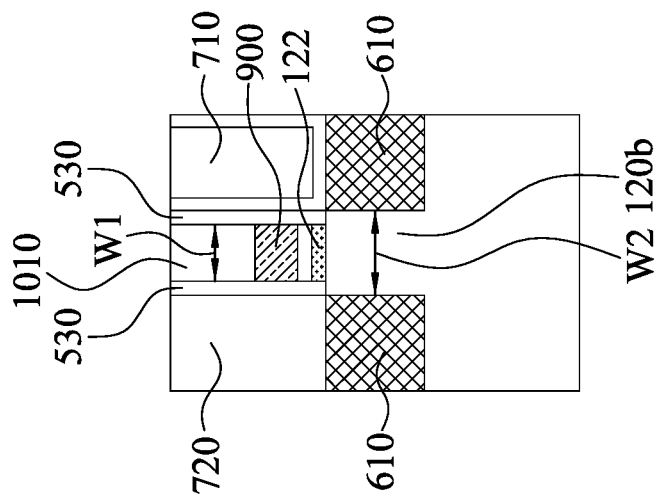
FIGS. 17A-17D are cross-sectional views of the embodiment of the semiconductor structure of the disclosure.
Figure 17B:
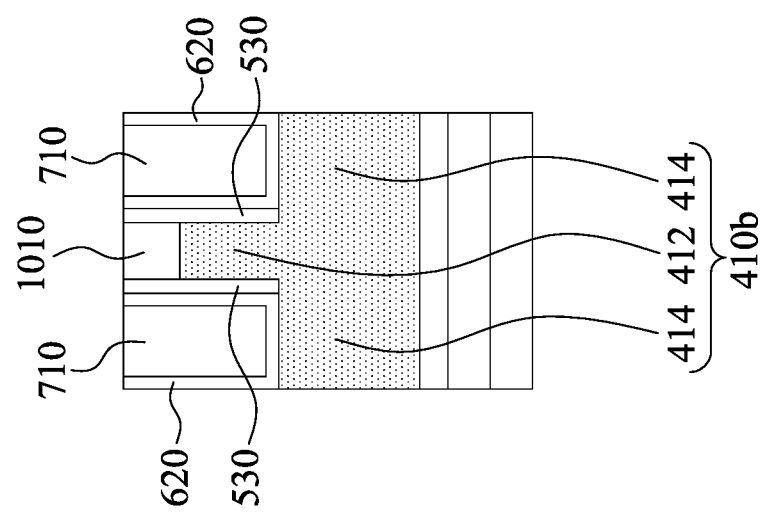
Figure 17A:
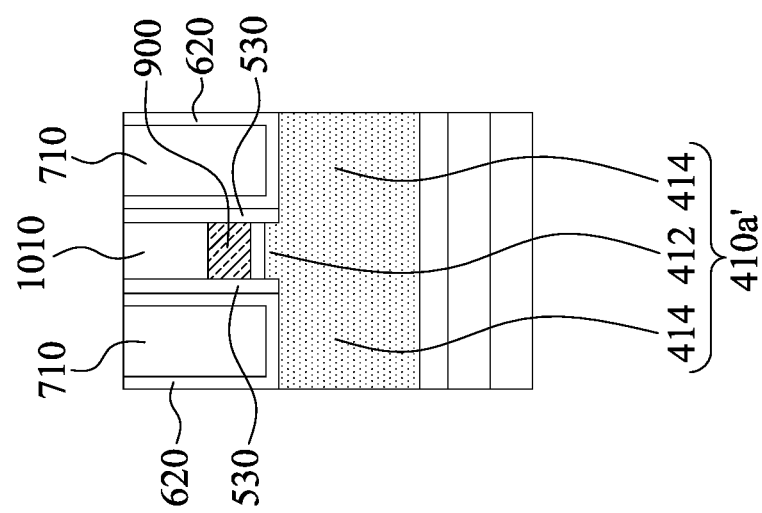

Reference is made to FIGS. 17A-17D, which are cross-sectional views of the embodiment of the semiconductor structure of the disclosure. FIG. 17A is a cross-sectional view taken along line A-A in FIG. 16. FIG. 17B is a cross-sectional view taken along line B-B in FIG. 16. FIG.

Figure 17D:
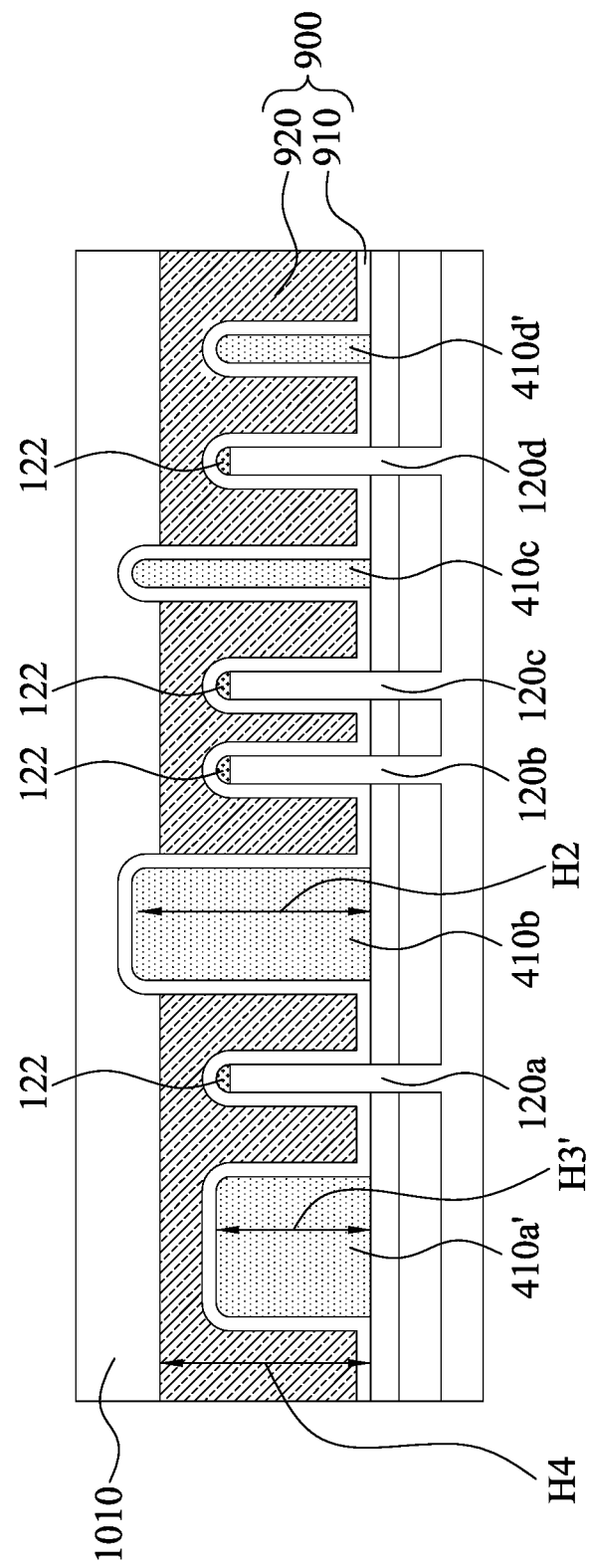

17C is a cross-sectional view taken along line C-C in FIG. 16. FIG. 17D is a cross-sectional view taken along line D-D in FIG. 16.

Referring to FIG. 17A, the portion of the semiconductor structure with the self-aligned isolation fin 410a' is shown. The self-aligned isolation fin 410a' serves as dummy fin, the metal gate structure 900 is disposed on the self-aligned isolation fin 410a', and the SAC layer 1010 is further disposed on the metal gate structure 900. The self-aligned isolation fin 410a' has a first portion 412 covered by the metal gate structure 900 and two second portions 414 disposed at opposite sides of the first portion 412. The interlayer dielectric layer 710 and the gate spacers 530 are disposed on opposite sides of the metal gate structure 900, the SAC layer 1010, and the first portion 412 of the self-aligned isolation fin 410a' and on the second portions 414, respectively. The top surfaces of the interlayer dielectric layer 710, the gate spacers 530, and the SAC layer 1010 are coplanar. The gate spacers 530 are disposed on sidewalls of the metal gate structure 900, the SAC layer 1010, and the first portion 412 of the self-aligned isolation fin 410a'. The gate spacers 530 interpose between the metal gate structure 900 and the interlayer dielectric layer 710. In some embodiments, the contact etch stop layer 620 wraps the bottom surface of the interlayer dielectric layer 710 and the sidewalls of the interlayer dielectric layer 710.

The height difference between the first portion 412 and the second portions 414 is depend on the recess processes as illustrated in FIGS. 13A-13E. For example, the first portion 412 can be shorter than the second portions 414 in some embodiments. Or, the first portion 412 can be higher than the second portions 414 in some other embodiments.

In this embodiment, the first portion 412 is higher than the second portions 414. The gate spacers 530 are disposed on and in contact with the sidewalls of the metal gate structure 900, the SAC layer 1010, and the first portion 412 of the self-aligned isolation fin 410a'. The interface between the metal gate structure 900 and the self-aligned isolation fin 410a' is higher than the interface between the interlayer dielectric layer 710 and the self-aligned isolation fin 410a', i.e. the bottom surface of the metal gate structure 900 is higher than the bottom surface of the interlayer dielectric layer 710. The interface between the metal gate structure 900 and the self-aligned isolation fin 410a' is higher than the interface between the gate spacers 530 and the self-aligned isolation fin 410a', i.e. the bottom surface of the metal gate structure 900 is higher than the bottom surface of the gate spacers 530.

Referring to FIG. 17B, the portion of the semiconductor structure with the self-aligned isolation fin 410b is shown. The self-aligned isolation fin 410b serves as cut polysilicon (CPO) pattern, and the metal gate structure (see FIG. 16) is separated by the self-aligned isolation fin 410b. The self-aligned isolation fin 410b has a first portion 412 and two second portions 414 disposed at opposite sides of the first portion 412. The SAC layer 1010 is formed on the top surface of the first portion of the self-aligned isolation fin 410b. The interlayer dielectric layer 710 and the gate spacers 530 are disposed on the second portions 414. The top surfaces of the interlayer dielectric layer 710, the SAC layer 1010, and the gate spacers 530 are coplanar. The gate spacers 530 are disposed on the sidewalls of the first portion 412 of the self-aligned isolation fin 410b and the SAC layer 1010 and are in contact with the interlayer dielectric layer 710.

Referring to FIG. 17C, the portion of the semiconductor structure with the active fin such as the active fin 120b is shown. The hard mask layer 122 remains on the active fin 120b. The metal gate structure 900 is disposed on the hard mask layer 122, and the SAC layer 1010 is disposed on the metal gate structure 900. The active fin 120b under the metal gate structure 900 serves as channel region. The epitaxial source/drains 610 are disposed at opposite sides of the active fin 120b and are not covered by the metal gate structure 900. The source/drain contacts 720 or the interlayer dielectric layer 710 are disposed on the epitaxial source/drains 610 and at opposite sides of the SAC layer 1010, the metal gate structure 900, and the hard mask layer 122. The gate spacers 530 are disposed on the sidewalls of the SAC layer 1010, the metal gate structure 900, and the hard mask layer 122 and are in contact with the source/drain contacts 720 or the interlayer dielectric layer 710. The top surfaces of the SAC layer 1010, the source/drain contacts 720, the interlayer dielectric layer 710, and the gate spacers 530 are coplanar.

In some embodiments, the width W1 of the SAC layer 1010, the metal gate structure 900, and the hard mask layer 122 is smaller than the width W2 of the active fin 120b. The gate spacers 530 are on the sidewalls of the SAC layer 1010, the metal gate structure 900, and the hard mask layer 122 and on the top surface of the active fin 120b. In some embodiments, the interface between the metal gate structure 900 and the hard mask layer 122 is higher than the interface between the gate spacers 530 and the active fin 120b, i.e. the bottom surface of the metal gate structure 900 is higher than the bottom surface of the gate spacers 530.

Referring to FIG. 17D, FIG. 17D is a cross-sectional view of the semiconductor structure taken along the metal gate structure 900. The active fins 120a-120d are covered by the metal gate structure 900 including the gate dielectric layer 910 and the metal gate electrode 920. The SAC layer 1010 is formed on the metal gate structure 900. The hard mask layer 122 remains between the active fins 120a-120d and the metal gate structure 900 at the cross-section taken along the metal gate structure 900. The heights H3 of the self-aligned isolation fins 410a and 410d are shorter than the heights H2 of the self-aligned isolation fins 410b and 410c. The height H4 of the metal gate structure 900 is shorter than the heights H2 of the self-aligned isolation fins 410b and 410c. The self-aligned isolation fins 410b and 410c are protruded from the metal gate structure 900, and the SAC layer 1010 is disposed on the top surfaces of the metal gate structure 900 and the self-aligned isolation fins 410b and 410c. The sidewalls of the self-aligned isolation fins 410b and 410c are deposited with the gate dielectric layer 910. The self-aligned isolation fins 410b and 410c serve as CPO in the metal gate structure 900. The self-aligned isolation fins 410a' and 410d' are covered by the metal gate structure 900 including the gate dielectric layer 910 and the metal gate electrode 920.

In some embodiments of the disclosure, the portions of the self-aligned isolation fins and the active fins uncovered by the poly gates are recessed prior to the formation of the gate spacers. Therefore, the gate spacers can protect the sidewall of the fin to prevent unwanted lateral damages.

According to some embodiments of the disclosure, a method includes etching a semiconductive substrate to form an active fin using a hard mask as an etching mask, wherein the active fin comprises a source region, a drain region, and a channel region between the source region and the drain region, the hard mask remains over the active fin after etching the semiconductive substrate, and the hard mask has a first portion vertically overlapping the source region of the active fin, a second portion vertically overlapping the channel region of the active fin, and a third portion vertically overlapping the drain region of the active fin. A sacrificial gate is formed over the second portion of the hard mask and the channel region of the active fin. The first and third portions of the hard mask are etched. After etching the first and third portions of the hard mask, a gate spacer is formed extending along sidewalls of the sacrificial gate, and the sacrificial gate is replaced with a replacement gate.

According to some other embodiments of the disclosure, a method includes etching a semiconductive substrate to form an active fin, forming an isolation fin over the semiconductive substrate, and forming a sacrificial gate over a channel region of the active fin and over a first portion of the isolation fin. Second and third portions of the isolation fin are free from coverage by the sacrificial gate, and the first portion of the isolation fin is between the second and third portions of the isolation fin. The second and third portions of the isolation fin are etched. After etching the second and third portions of the isolation fin, a gate spacer is formed extending along sidewalls of the sacrificial gate, and the sacrificial gate is replaced with a replacement gate.

According to some other embodiments of the disclosure, a method includes etching a semiconductive substrate to form an active fin using a hard mask as a first etching mask, in which the hard mask remains over the active fin after etching the semiconductive substrate. First and second isolation fins are formed over the semiconductive substrate. A sacrificial gate is formed over the hard mask and a channel region of the active fin, over a first portion of the first isolation fin, and over a first portion of the second isolation fin. A gate spacer is formed extending along sidewalls of the sacrificial gate. A mask pattern is formed vertically overlapping the first portion of the first isolation fin, in which the hard mask and the first portion of the second isolation fin are free from coverage by the mask pattern. The sacrificial gate, the hard mask, and the first portion of the second isolation fin are etched using the mask pattern as a second etching mask. The mask pattern and a remaining portion of the sacrificial gate are etched to form a gate trench. The gate trench is filled with a replacement gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   etching a semiconductive substrate to form an active fin using a hard mask as an etching mask, wherein the active fin comprises a source region, a drain region, and a channel region between the source region and the drain region, the hard mask remains over the active fin after etching the semiconductive substrate, and the hard mask has a first portion vertically overlapping the source region of the active fin, a second portion vertically overlapping the channel region of the active fin, and a third portion vertically overlapping the drain region of the active fin;
   forming a sacrificial gate over the second portion of the hard mask and the channel region of the active fin;
   etching the first and third portions of the hard mask;
   after etching the first and third portions of the hard mask, forming a gate spacer extending along sidewalls of the sacrificial gate; and
   replacing the sacrificial gate with a replacement gate.

2. The method of claim 1, wherein the second portion of the hard mask remains over the channel region of the active fin after replacing the sacrificial gate with the replacement gate.

3. The method of claim 1, wherein replacing the sacrificial gate with the replacement gate comprises:
   etching the sacrificial gate to form a gate trench;
   depositing a gate dielectric layer in the gate trench and having a first portion over the second portion of the hard mask and a second portion extending along sidewalls of the channel region of the active fin; and
   depositing a metal gate in the gate trench and over the gate dielectric layer.

4. The method of claim 3, further comprising depositing a dielectric liner over the hard mask and the active fin before forming the sacrificial gate.

5. The method of claim 4, further comprising:
   etching the dielectric liner to expose the second portion of the hard mask; and
   etching the second portion of the hard mask, wherein depositing the gate dielectric layer is performed such that the gate dielectric layer is deposited over the etched second portion of the hard mask.

6. The method of claim 1, further comprising after forming the gate spacer, etching the second portion of the hard mask such that the etched second portion of the hard mask has a convex top surface.

7. The method of claim 1, wherein the second portion of the hard mask is between the channel region of the active fin and the replacement gate after replacing the sacrificial gate with the replacement gate.

8. The method of claim 1, further comprising:
   recessing the source region of the active fin; and
   growing an epitaxial structure over the recessed source region of the active fin.

9. The method of claim 8, further comprising:
   forming a contact over the epitaxial structure, wherein the gate spacer is directly between the second portion of the hard mask and the contact.

10. The method of claim 1, wherein forming the gate spacer is performed such that a sidewall of the gate spacer aligns a sidewall of the channel region of the active fin.

11. The method of claim 1, wherein forming the gate spacer is performed such that the gate spacer is in contact with the second portion of the hard mask.

12. A method, comprising:
    etching a semiconductive substrate to form an active fin;
    forming an isolation fin over the semiconductive substrate;
    forming a sacrificial gate over a channel region of the active fin and over a first portion of the isolation fin, wherein second and third portions of the isolation fin are free from coverage by the sacrificial gate, and the first portion of the isolation fin is between the second and third portions of the isolation fin;
    etching the second and third portions of the isolation fin;
    after etching the second and third portions of the isolation fin, forming a gate spacer extending along sidewalls of the sacrificial gate; and
    replacing the sacrificial gate with a replacement gate.

13. The method of claim 12, wherein forming the gate spacer is performed such that the gate spacer is in contact with sidewalls of the first portion of the isolation fin before replacing the sacrificial gate with the replacement gate.

14. The method of claim 12, further comprising recessing the first portion of the isolation fin such that a top surface of the first portion of the isolation fin is lower than a top surface of the second portion of the isolation fin.

15. The method of claim 14, wherein replacing the sacrificial gate with the replacement gate comprises:
   etching the sacrificial gate to form a gate trench; and
   forming the replacement gate in the gate trench, over the recessed first portion of the isolation fin, and between the second and third portions of the isolation fin.

16. The method of claim 15, wherein a portion of the replacement gate is in contact with the second portion of the isolation fin.

17. The method of claim 12, wherein forming the isolation fin is performed such that the isolation fin is wider than the active fin.

18. A method, comprising:
   etching a semiconductive substrate to form an active fin using a hard mask as a first etching mask, wherein the hard mask remains over the active fin after etching the semiconductive substrate;
   forming first and second isolation fins over the semiconductive substrate;
   forming a sacrificial gate over the hard mask and a channel region of the active fin, over a first portion of the first isolation fin, and over a first portion of the second isolation fin;
   forming a gate spacer extending along sidewalls of the sacrificial gate;
   forming a mask pattern vertically overlapping the first portion of the first isolation fin, wherein the hard mask and the first portion of the second isolation fin are free from coverage by the mask pattern;
   etching the sacrificial gate, the hard mask, and the first portion of the second isolation fin using the mask pattern as a second etching mask;
   etching the mask pattern and a remaining portion of the sacrificial gate to form a gate trench; and
   filling the gate trench with a replacement gate.

19. The method of claim 18, wherein a top surface of the first portion of the second isolation fin is lower than the channel region of the active fin after etching the sacrificial gate, the hard mask, and the first portion of the second isolation fin.

20. The method of claim 18, further comprising etching the replacement gate such that a top surface of the replacement gate is lower than a top surface of the first portion of the first isolation fin.

* * * * *